US010268576B2

(12) United States Patent
Ueki et al.

(10) Patent No.: US 10,268,576 B2
(45) Date of Patent: Apr. 23, 2019

(54) SEMICONDUCTOR DEVICE AND CONTROL METHOD THEREOF

(71) Applicant: Renesas Electronics Corporation, Tokyo (JP)

(72) Inventors: Hiroshi Ueki, Tokyo (JP); Eiji Koeta, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/914,875

(22) Filed: Mar. 7, 2018

(65) Prior Publication Data

US 2018/0341581 A1 Nov. 29, 2018

(30) Foreign Application Priority Data

May 23, 2017 (JP) ................................. 2017-101502

(51) Int. Cl.
*G06F 11/14* (2006.01)
*G06F 12/02* (2006.01)
(Continued)

(52) U.S. Cl.
CPC .......... *G06F 12/0246* (2013.01); *G11C 16/16* (2013.01); *G11C 16/3459* (2013.01);
(Continued)

(58) Field of Classification Search
CPC . G06F 12/0246; G11C 16/16; G11C 16/3459; G11C 29/021; H01L 27/11521; H01L 27/11531
(Continued)

(56) References Cited

U.S. PATENT DOCUMENTS 7,444,449 B2* 10/2008 Åberg ................... G06F 9/4812
710/260
7,930,589 B2* 4/2011 Lavastre ............. G06F 12/0246
714/23
(Continued)

FOREIGN PATENT DOCUMENTS

JP H 11-24942 A 1/1999

*Primary Examiner* — Xiaochun L Chen
(74) *Attorney, Agent, or Firm* — McGinn I.P. Law Group, PLLC.

(57) ABSTRACT

An object of the present invention is to provide a semiconductor device and a control method thereof that can suppress a circuit scale from being increased while maintaining a high interruption response performance.
According to an embodiment, a semiconductor device includes a flash memory in which N interruption subroutine programs are stored, an interruption control circuit that detects occurrence of an interruption, counters that determine the respective occurrence probabilities of N interruption factors on the basis of the detection result of the interruption control circuit, an interruption buffer memory in which the M (M<N) interruption subroutine programs corresponding to the top M interruption factors determined to be high in the occurrence probability among the N interruption factors are stored, and a CPU that reads, in the case where an interruption of one of the M interruption factors has occurred, the interruption subroutine program corresponding to the interruption from the interruption buffer memory to execute the same.

20 Claims, 18 Drawing Sheets

(51) Int. Cl.
  *G11C 16/16*     (2006.01)
  *H01L 27/11521*  (2017.01)
  *G11C 29/02*     (2006.01)
  *H01L 27/11531*  (2017.01)
  *G11C 16/34*     (2006.01)
(52) U.S. Cl.
  CPC ...... *G11C 29/021* (2013.01); *H01L 27/11521* (2013.01); *H01L 27/11531* (2013.01)
(58) Field of Classification Search
  USPC .................................................. 365/185.22
  See application file for complete search history.

(56) References Cited

U.S. PATENT DOCUMENTS

| | | | | |
|---|---|---|---|---|
| 2002/0166018 A1* | 11/2002 | Kim | ........................ | G06F 13/26 |
| | | | | 710/260 |
| 2007/0028141 A1* | 2/2007 | Lavastre | ............. | G06F 12/0246 |
| | | | | 714/23 |
| 2007/0186024 A1* | 8/2007 | Aberg | .................... | G06F 9/4812 |
| | | | | 710/269 |
| 2013/0145194 A1* | 6/2013 | Kleiber | ................. | G06F 1/3228 |
| | | | | 713/323 |
| 2014/0075241 A1* | 3/2014 | Oh | ........................ | G06F 11/141 |
| | | | | 714/15 |
| 2016/0203873 A1* | 7/2016 | Kuribara | ................ | G11C 16/26 |
| | | | | 365/185.24 |

\* cited by examiner

*FIG. 14*

INT_1; $\mu_1 = \alpha_1 / (\alpha_1 + \beta_1)$
INT_2; $\mu_2 = \alpha_2 / (\alpha_2 + \beta_2)$
INT_3; $\mu_3 = \alpha_3 / (\alpha_3 + \beta_3)$
$\vdots$
INT_N; $\mu_N = \alpha_N / (\alpha_N + \beta_N)$

⬇ OCCURRENCE OF INT_3

INT_1; $\mu_1' = (\alpha_1) / (\alpha_1 + \beta_1 + 1)$
INT_2; $\mu_2' = (\alpha_2) / (\alpha_2 + \beta_2 + 1)$
INT_3; $\mu_3' = (\alpha_3 + 1) / (\alpha_3 + \beta_3 + 1)$
$\vdots$
INT_N; $\mu_N' = (\alpha_N) / (\alpha_N + \beta_N + 1)$

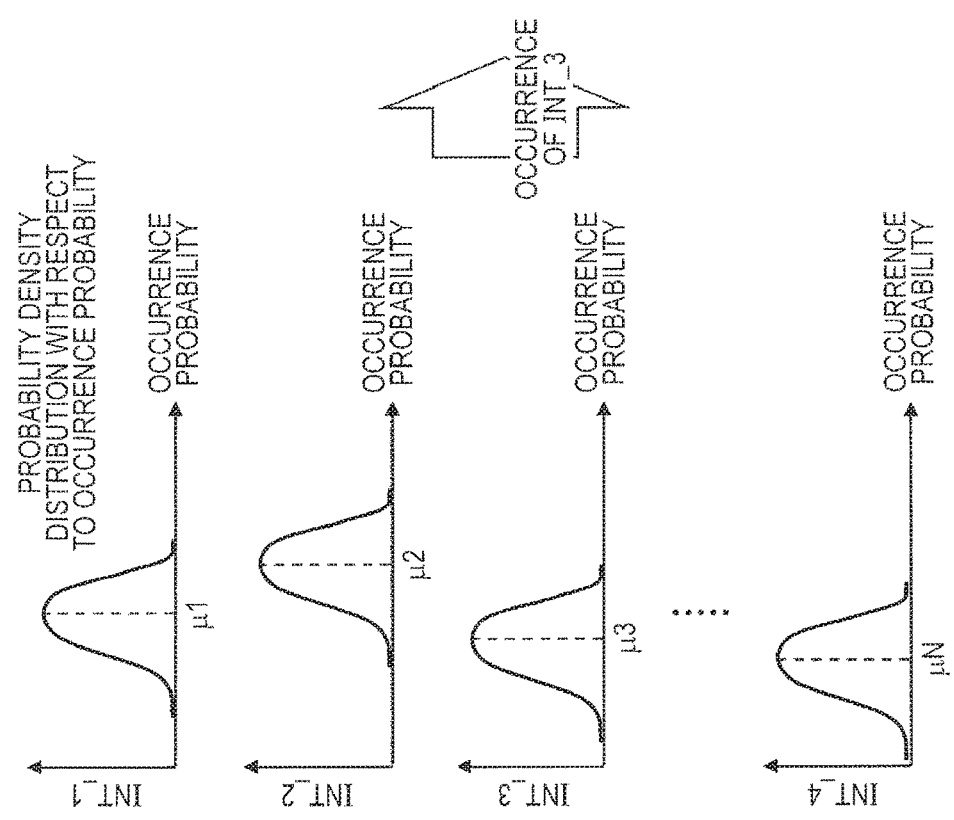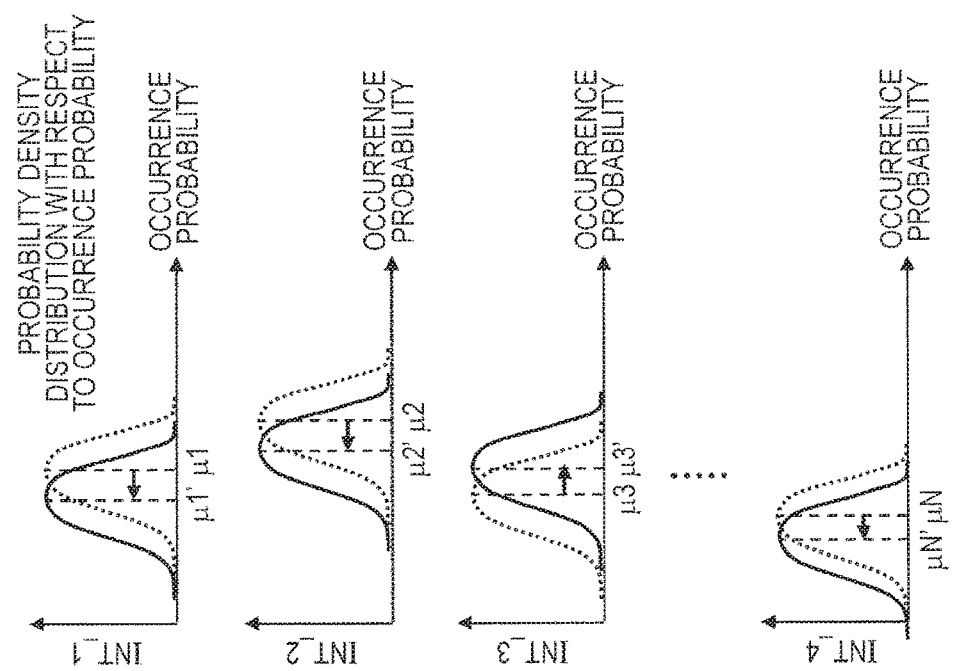
FIG. 15

SEMICONDUCTOR DEVICE AND CONTROL METHOD THEREOF

CROSS-REFERENCE TO RELATED APPLICATIONS

The disclosure of Japanese Patent Application No. 2017-101502 filed on May 23, 2017 including the specification, drawings and abstract is incorporated herein by reference in its entirety.

BACKGROUND

The present invention relates to a semiconductor device and a control method thereof, and, for example, a semiconductor device and a control method thereof suitable for suppressing a circuit scale from being increased while maintaining a high interruption response performance.

For example, a CPU (Central Processing Unit) executes a program with a designated address among those stored in a flash memory in a microcomputer. Here, in the case where the program with the designated address is stored in a cache memory, the CPU reads the program from the cache memory, and executes the same without accessing the flash memory. On the other hand, in the case where the program with the designated address is not stored in the cache memory, the CPU transfers the program with the designated address stored in the flash memory to the cache memory, and executes the same. This is not limited to a case of a main routine program, but is also the same in the case where an interruption such as a timer interruption, a communication IP interruption, or an external terminal interruption occurs.

However, unlike the case of the main routine program, an interruption subroutine program corresponding to an interruption is not usually stored in the cache memory. Therefore, since it is necessary to access the flash memory every time an interruption occurs, there is a problem that the microcomputer cannot immediately execute the interruption subroutine program. In other words, there is a problem that the microcomputer cannot improve the responsiveness of the interruption.

A solution for such a problem is disclosed in Japanese Unexamined Patent Application Publication No. Hei 11 (1999)-24942. A microcomputer disclosed in Japanese Unexamined Patent Application Publication No. Hei 11 (1999)-24942 includes, in addition to a first command queue (cache memory) in which a main routine program is temporarily stored, a second command queue (interruption buffer memory) in which all interruption subroutine programs corresponding to a plurality of interruption factors are stored. Accordingly, since it is not necessary to access the memory (flash memory) for storing programs every time an interruption occurs, the microcomputer can improve the interruption responsiveness.

SUMMARY

In the configuration of Japanese Unexamined Patent Application Publication No. Hei 11 (1999)-24942, it is necessary to provide the interruption buffer memory in which all the interruption subroutine programs corresponding to the interruption factors can be stored, and thus there is a problem that the circuit scale is increased. The other problems and novel features will become apparent from the description of the specification and the accompanying drawings.

According to an embodiment, provided is a semiconductor device including: a flash memory in which at least N (N is an integer equal to or larger than 2) interruption subroutine programs are stored; an interruption control circuit that detects that an interruption of one of N interruption factors has occurred; a determination circuit that determines the occurrence probability of each of the N interruption factors on the basis of the detection result of the interruption control circuit; an interruption buffer memory in which the M (M<N) interruption subroutine programs corresponding to the top M interruption factors determined to be high in the occurrence probability by the determination circuit among the N interruption factors are stored; and an arithmetic processing circuit that reads, in the case where an interruption of one of the M interruption factors has occurred, the interruption subroutine program corresponding to the interruption that has occurred from the interruption buffer memory, and executes the same.

According to another embodiment, provided is a control method of a semiconductor device including the steps of: detecting that an interruption of one of N (N is an integer equal to or larger than 2) interruption factors has occurred; determining the occurrence probability of each of the N interruption factors on the basis of the detection result; reading M (M<N) interruption subroutine programs corresponding to the top M interruption factors determined to be high in the occurrence probability among the N interruption factors from a flash memory to store the same into an interruption buffer memory; and reading, in the case where an interruption of one of the M interruption factors has occurred, the interruption subroutine program corresponding to the interruption that has occurred from the interruption buffer memory to execute the same.

According to the above-described embodiment, it is possible to provide a semiconductor device that can suppress a circuit scale from being increased while maintaining a high interruption response performance.

BRIEF DESCRIPTION OF THE DRAWINGS

FIG. 14 is a diagram for showing an example of changes in the expected values of the occurrence probabilities of interruptions;

FIG. 15 is a diagram for showing the distribution and changes of the occurrence probabilities of interruptions;

DETAILED DESCRIPTION

Hereinafter, embodiments will be described with reference to the drawings. It should be noted that since the drawings are simply illustrated, the technical scope of the embodiments shall not be narrowly construed on the basis of the description of the drawings. Further, the same elements are followed by the same signs, and the duplicated explanation will be omitted.

The present invention will be described using the following embodiments while being divided into a plurality of sections or embodiments if necessary for convenience sake. However, except for a case especially specified, the sections or embodiments are not irrelevant to each other, and one has a relationship as a part or all of a modified example, an application, a detailed explanation, or a supplementary explanation of the other. Further, when the specification refers to the number of elements (including the number of pieces, values, amounts, ranges, and the like) in the following embodiments, the number is not limited to the specific number, but may be smaller or larger than the specific number, except for a case especially specified or a case obviously limited to the specific number in principle.

Furthermore, the constitutional elements (including operational steps and the like) are not necessarily essential in the following embodiments except for a case especially specified or a case obviously deemed to be essential in principle. Likewise, when the specification refers to the shapes or positional relationships of the constitutional elements in the following embodiments, the present invention includes the constitutional elements that are substantially close or similar in shapes and the like, except for a case especially specified or a case obviously deemed not to be close or similar in principle. The same applies to the number (including the number of pieces, values, amounts, ranges, and the like).

<Previous Consideration by Inventors>

Before describing the details of a semiconductor device according to a first embodiment, a semiconductor device previously considered by the inventors will be described.

Figure 17:
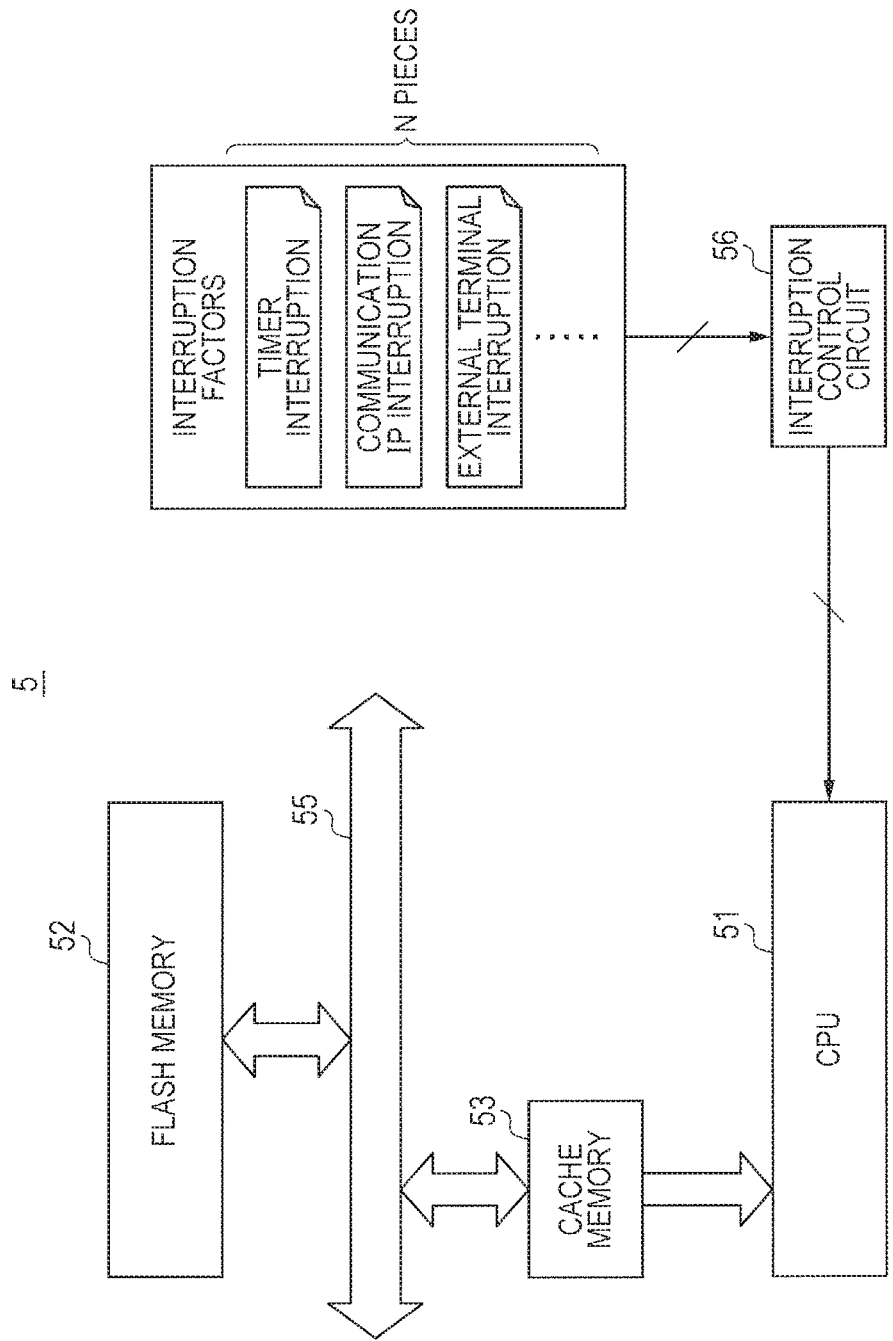
FIG. 17 is a diagram for showing a configuration of a semiconductor device according to an idea before leading to the embodiment.

FIG. 17 is a diagram for showing a configuration of a semiconductor device 5 according to an idea before leading to the embodiment. The semiconductor device 5 is a so-called microcomputer, and includes a CPU 51, a flash memory 52, a cache memory 53, a data bus 55, and an interruption control circuit 56.

At least, a plurality of main routine programs and N (N is an integer equal to or larger than 2) interruption subroutine programs corresponding to N interruption factors are stored in the flash memory 52. It should be noted that the interruption factors include, for example, a timer interruption, a communication IP interruption, an external terminal interruption, and the like.

The interruption control circuit 56 detects that an interruption of one of the N interruption factors has occurred.

The CPU 51 executes a program with a designated address among those stored in the flash memory 52. Here, in the case where the program with the designated address is stored in the cache memory 53, the CPU 51 reads the program from the cache memory 53 without accessing the flash memory 52, and executes the same. On the other hand, in the case where the program with the designated address is not stored in the cache memory 53, the CPU 51 transfers the program with the designated address stored in the flash memory 52 to the cache memory 53 via the data bus 55, and executes the same. This is not limited to the case of the main routine program, and the same applies to a case in which an interruption has occurred.

Specifically, in the case where the interruption control circuit 56 detects that an interruption of one of the N interruption factors has occurred, the CPU 51 executes the interruption subroutine program corresponding to the detected interruption factor among the N interruption subroutine programs stored in the flash memory 52. Here, in the case where the interruption subroutine program corresponding to the detected interruption factor is stored in the cache memory 53, the CPU 51 reads the interruption subroutine program from the cache memory 53 without accessing the flash memory 52, and executes the same. On the other hand, in the case where the interruption subroutine program corresponding to the detected interruption factor is not stored in the cache memory 53, the CPU 51 transfers the interruption subroutine program stored in the flash memory 52 to the cache memory 53, and executes the same.

However, unlike the case of the main routine program, the interruption subroutine program is usually not stored in the cache memory 53. Thus, since the semiconductor device 5 needs to access the flash memory 52 every time an interruption occurs, there is a problem that the interruption subroutine program cannot be immediately executed. In other words, there is a problem that the semiconductor device 5 cannot improve the responsiveness to the interruption.

In order to solve such a problem, the inventors subsequently considered a semiconductor device 6.

Figure 18:
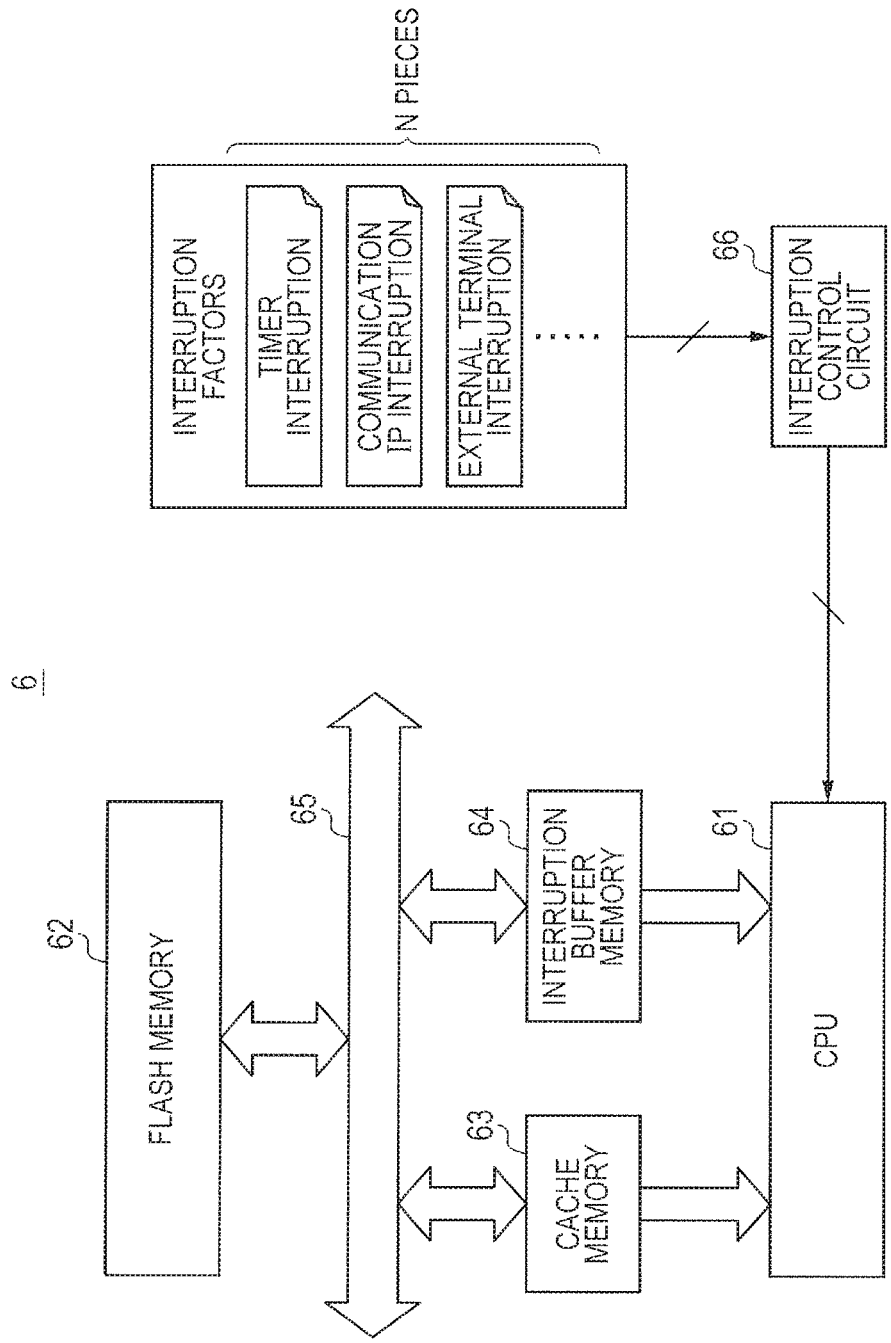
FIG. 18 is a diagram for showing a configuration of a semiconductor device according to an idea before leading to the embodiment.

FIG. 18 is a diagram for showing a configuration of a semiconductor device 6 according to an idea before leading to the embodiment. The semiconductor device 6 is a so-called microcomputer, and includes a CPU 61, a flash memory 62, a cache memory 63, an interruption buffer memory 64, a data bus 65, and an interruption control circuit 66.

Here, the CPU 61, the flash memory 62, the cache memory 63, the data bus 65, and the interruption control circuit 66 correspond to the CPU 51, the flash memory 52, the cache memory 53, the data bus 55, and the interruption control circuit 56 in the semiconductor device 5, respectively.

Namely, the semiconductor device 6 includes, as compared to the semiconductor device 5, the interruption buffer memory 64 in which all the N interruption subroutine programs corresponding to the N interruption factors are stored, in addition to the cache memory 63 in which the main routine program is temporarily stored. The other configurations of the semiconductor device 6 are the same as the case of the semiconductor device 5, and thus the explanation thereof will be omitted.

In the case where the interruption control circuit 66 detects that an interruption of one of the N interruption factors has occurred, the CPU 61 reads the interruption subroutine program corresponding to the detected interruption factor from the interruption buffer memory 64, and executes the same. Accordingly, the semiconductor device 6 does not need to access the flash memory 62 every time an interruption occurs, and thus the interruption responsiveness can be improved.

However, since the semiconductor device 6 needs to have the interruption buffer memory in which all the N interruption subroutine programs corresponding to the N interruption factors can be stored, there has been a problem that the circuit scale is increased. Further, as a result, there has been a problem that the power consumption is increased.

Accordingly, the inventors found a semiconductor device 1 according to the first embodiment that can suppress the circuit scale from being increased while maintaining a high interruption response performance.

First Embodiment

Figure 1:
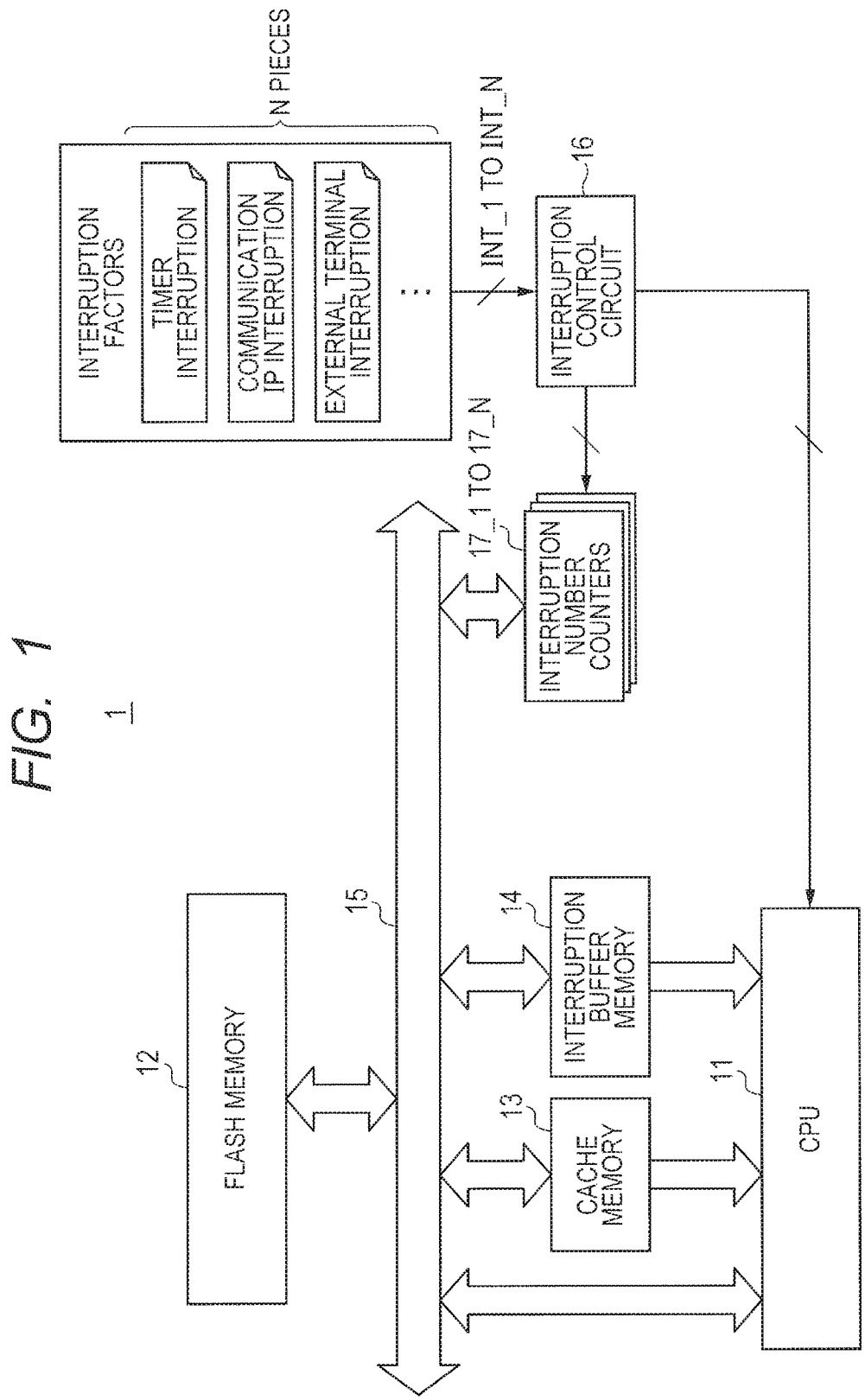
FIG. 1 is a block diagram for showing a configuration example of a semiconductor device according to a first embodiment.

FIG. 1 is a block diagram for showing a configuration example of the semiconductor device 1 according to the first embodiment. The semiconductor device 1 is a so-called microcomputer, and includes a CPU 11, a flash memory 12, a cache memory 13, an interruption buffer memory 14, a data bus 15, an interruption control circuit 16, and N (N is an integer equal to or larger than 2) interruption number counters 17_1 to 17_N.

At least, a plurality of main routine programs and N interruption subroutine programs corresponding to N interruption factors are stored in the flash memory 12. It should be noted that the interruption factors include, for example, a timer interruption, a communication IP interruption, an external terminal interruption, and the like.

The CPU 11 executes a main routine program with a designated address among a plurality of programs stored in the flash memory 12. Here, in the case where the main routine program with the designated address is stored in the cache memory 13, the CPU 11 reads the program from the cache memory 13 without accessing the flash memory 12, and executes the same. On the other hand, in the case where the main routine program with the designated address is not stored in the cache memory 13, the CPU 11 transfers the main routine program with the designated address stored in the flash memory 12 to the cache memory 13 via the data bus 15, and executes the same. The other functions of the CPU 11 will be described later.

The interruption control circuit 16 detects that an interruption of one of the N interruption factors has occurred. Hereinafter, the respective interruptions of the N interruption factors will be also referred to as interruptions INT_1 to INT_N.

(Configuration Example of Interruption Control Circuit 16)

Figure 2:
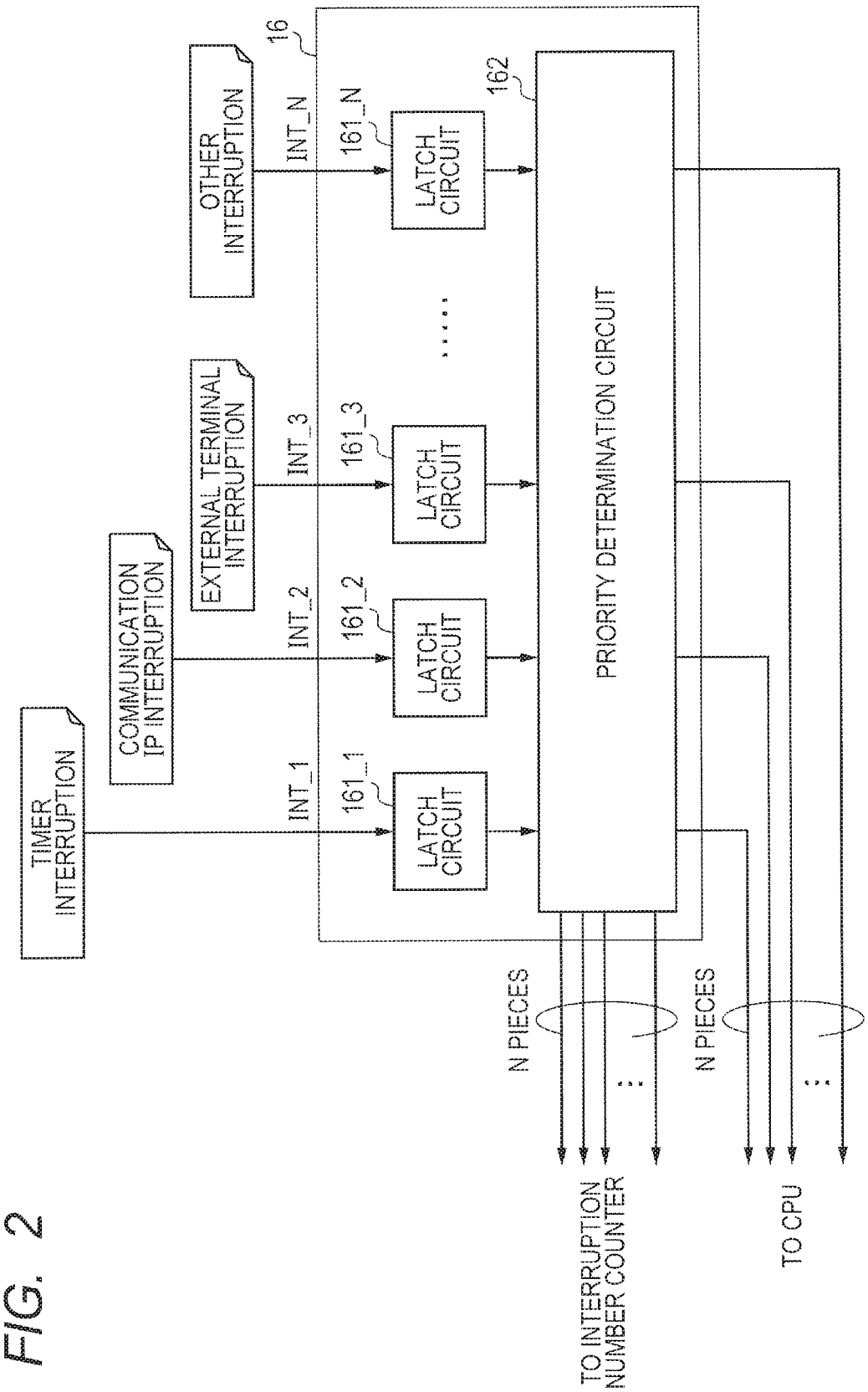
FIG. 2 is a diagram for showing a configuration example of an interruption control circuit provided in the semiconductor device shown in FIG. 1.

FIG. 2 is a block diagram for showing a configuration example of the interruption control circuit 16.

As shown in FIG. 2, the interruption control circuit 16 has latch circuits 161_1 to 161_N and a priority determination circuit 162.

The latch circuits 161_1 to 161_N latch the interruptions INT_1 to INT_N of the N interruption factors, respectively. The priority determination circuit 162 outputs the interruptions INT_1 to INT_N latched by the latch circuits 161_1 to 161_N to the corresponding interruption number counters and the CPU 11 in accordance with a preliminarily-set priority order. It should be noted that after outputting the interruptions INT_i (i is an arbitrary integer from 1 to N) latched by the latch circuits 161_i, the priority determination circuit 162 initializes the latch circuits 161_i.

The explanation will be continued with reference to FIG. 1 again.

The interruption number counters 17_1 to 17_N count the numbers of occurrences of interruptions INT_1 to INT_N detected by the interruption control circuit 16, respectively. Here, as the occurrence frequency of the interruptions INT_1 to INT_N becomes higher and the count values of the interruption number counters 17_1 to 17_N become larger, it can be estimated that the occurrence probability of the interruptions INT_1 to INT_N is high. Therefore, the interruption number counters 17_1 to 17_N can be regarded as determination circuits that determine the occurrence probability on the basis of the occurrence frequency of the interruptions INT_1 to INT_N. It should be noted that the initial values of the interruption number counters 17_1 to 17_N are set to, for example, "0". Alternatively, the initial values are set to predetermined count values determined in accordance with the specifications.

The CPU 11 reads M (M<N) interruption subroutine programs corresponding to the counters indicating up to the M-th largest count values among the interruption number counters 17_1 to 17_N from the flash memory 12, and stores the same into the interruption buffer memory 14. It should be noted that in the case where each of the count values of the interruption number counters 17_1 to 17_N indicates the initial value "0", the CPU 11 reads the M interruption subroutine programs corresponding to predetermined M interruption factors determined to be high in the occurrence probability by an experience value or the like from the flash memory 12, and stores the same into the interruption buffer memory 14.

Figure 3:
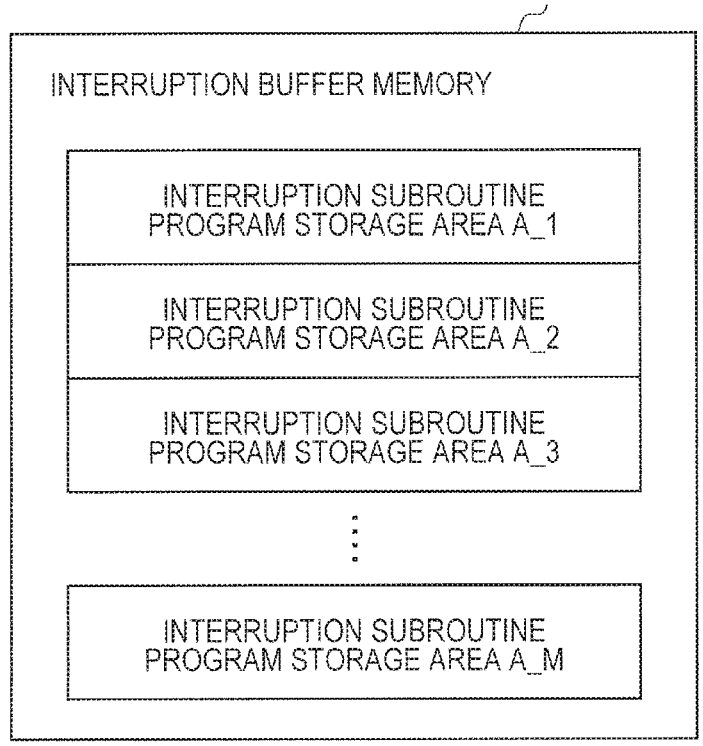
FIG. 3 is a diagram for showing a configuration example of an interruption buffer memory provided in the semiconductor device shown in FIG. 1.

FIG. 3 is a diagram for showing a configuration example of the interruption buffer memory 14. With reference to FIG. 3, the interruption buffer memory 14 is provided with M storage areas A_1 to A_M into which the M interruption subroutine programs can be stored. Here, the interruption buffer memory 14 is provided with the storage areas A_1 to A_M that are less than the areas into which all the N interruption subroutine programs can be stored. Therefore, the circuit scale of the interruption buffer memory 14 can be made smaller than that of the interruption buffer memory 64.

The explanation will be continued with reference to FIG. 1 again.

In the case where the interruption control circuit 16 detects that an interruption of one of the N interruption factors has occurred, the CPU 11 executes the interruption subroutine program corresponding to the detected interruption factor among the N interruption subroutine programs stored in the flash memory 12.

Here, the M interruption subroutine programs corresponding to the M interruption factors each indicating a high occurrence frequency (that is, estimated to be high in the occurrence probability) are stored in the interruption buffer memory 14. Therefore, in the case where the interruption has occurred, the CPU 11 can read the corresponding interruption subroutine program from the interruption buffer memory 14 without accessing the flash memory 12 with high probability, and can execute the same.

It should be noted that in the case where an interruption of a factor other than those indicating up to the M-th highest occurrence frequencies has occurred (that is, in the case where an interruption of a factor having a low occurrence frequency has occurred), the CPU 11 transfers the corresponding interruption subroutine program stored in the flash memory 12 to the cache memory 13, and executes the same.

(Operation of Semiconductor Device 1)

Next, an operation of the semiconductor device 1 will be described with reference to FIG. 4.

Figure 4:
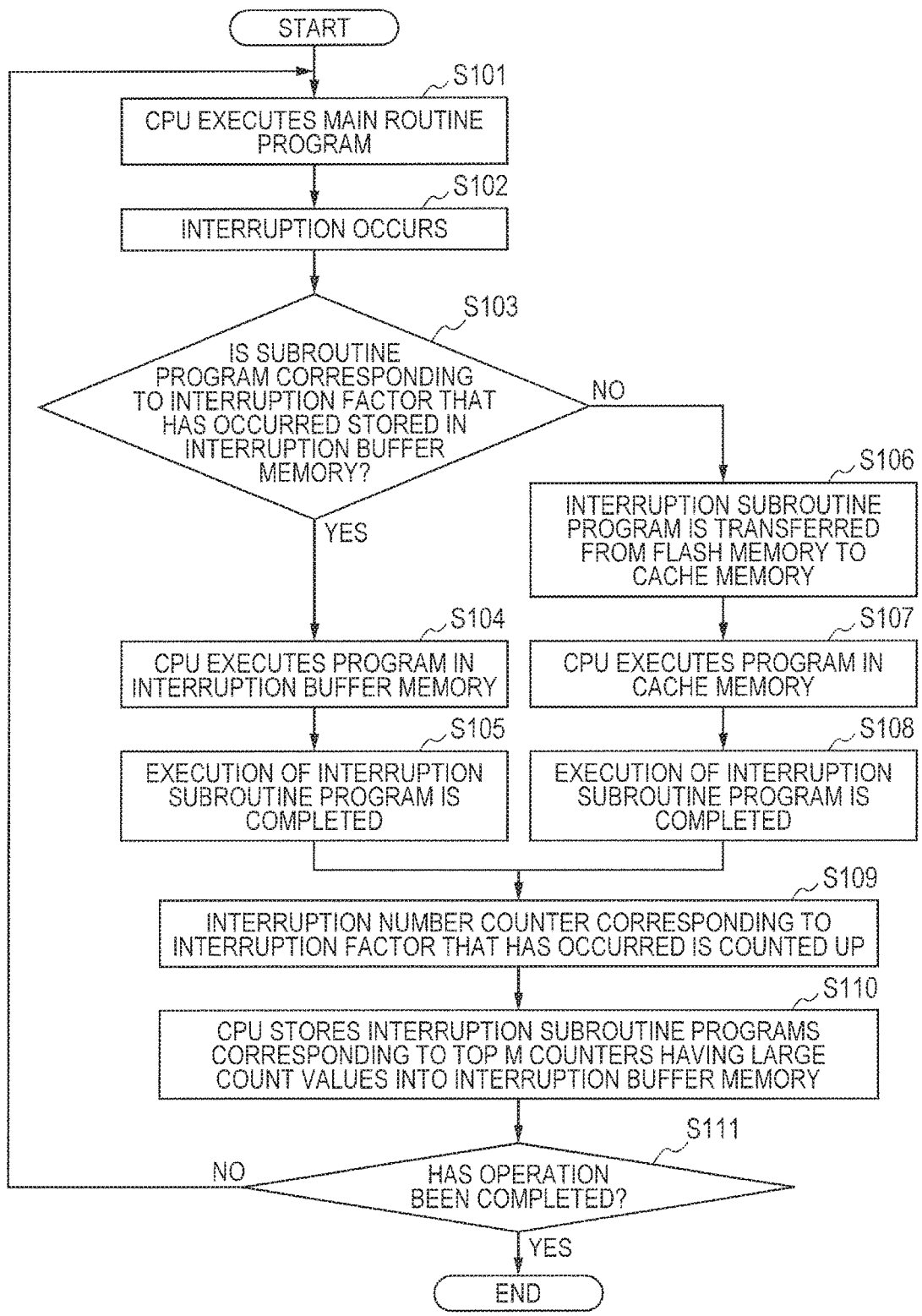
FIG. 4 is a flowchart for showing an operation of the semiconductor device shown in FIG. 1.

FIG. 4 is a flowchart for showing an operation of the semiconductor device 1. It should be noted that, as an example, the number of interruption factors is 20 (N=20) and the number of interruption subroutine programs stored in the interruption buffer memory 14 is 5 (M=5) in the following description.

In the initial state, each of the interruption number counters 17_1 to 17_N indicates the count value "0". Therefore, the predetermined M interruption subroutine programs determined to be high in the occurrence probability by an experience value or the like are stored in the interruption buffer memory 14.

First, the CPU 11 executes the main routine program (Step S101).

Thereafter, an interruption of one of the N interruption factors occurs (Step S102).

At this time, the CPU 11 confirms whether or not the interruption subroutine program corresponding to the interruption factor that has occurred is stored in the interruption buffer memory 14 (Step S103).

For example, in the case where the interruption subroutine program corresponding to the interruption factor that has occurred is stored in the interruption buffer memory 14 (YES in Step S103), the CPU 11 reads the interruption subroutine program from the interruption buffer memory 14, and executes the same (Step S104).

Thereafter, when the execution of the interruption subroutine program is completed (Step S105), the count value of one of the counters 17_1 to 17_N corresponding to the interruption factor that has occurred is counted up (Step S109). For example, in the case where the interruption INT_1 has occurred, the count value of the counter 17_1 corresponding to the interruption INT_1 is counted up. It should be noted that there is a possibility that the orders of the count values of the interruption number counters 17_1 to 17_N are replaced as a result.

On the contrary, in the case where the interruption subroutine program corresponding to the interruption factor that has occurred is not stored in the interruption buffer memory 14 (NO in Step S103), the CPU 11 transfers the interruption subroutine program stored in the flash memory 12 to the cache memory 13, and executes the same (Steps S106 and S107).

Thereafter, when the execution of the interruption subroutine program is completed (Step S108), the count value of one of the counters 17_1 to 17_N corresponding to the interruption factor that has occurred is counted up (Step S109). For example, in the case where the interruption INT_2 has occurred, the count value of the counter 17_2 corresponding to the interruption INT_2 is counted up. It should be noted that there is a possibility that the orders of the count values of the interruption number counters 17_1 to 17_N are replaced as a result.

When the count-up operation performed by one of the interruption number counters 17_1 to 17_N is completed, the CPU 11 reads the M interruption subroutine programs corresponding to the counters indicating up to the M-th largest count values among the interruption number counters 17_1 to 17_N from the flash memory 12, and stores the same into the interruption buffer memory 14 (Step S110). Thereby, the M interruption subroutine programs already stored in the interruption buffer memory 14 are overwritten by the M interruption subroutine programs newly read from the flash memory 12.

Thereafter, in the case where the operation performed by the CPU 11 has been completed (YES in Step S111), the semiconductor device 1 terminates the operation. In the case where the operation performed by the CPU 11 has not been completed (NO in Step S111), the flow returns to the process of Step S101 to repeat the operations of Step S101 to S111.

As described above, the semiconductor device 1 according to the embodiment includes the interruption buffer memory 14 that stores therein only the M interruption subroutine programs corresponding to the M interruption factors indicating high occurrence frequencies among the N interruption factors. Accordingly, the semiconductor device 1 according to the embodiment can suppress the circuit scale and the power consumption from being increased while mainlining a high interruption response performance. Specifically, in the case where N is 20 and M is 5, the circuit scale of the interruption buffer memory 14 can be suppressed to about a quarter of that in the case of the semiconductor device 6.

(First Modified Example of Semiconductor Device 1)

In the embodiment, a case in which the interruption subroutine programs stored in the interruption buffer memory 14 are rewritten in accordance with the completion of the count-up operation performed by one of the interruption number counters 17_1 to 17_N has been described as an example. However, the present invention is not limited to this. The interruption subroutine programs stored in the interruption buffer memory 14 may be rewritten at a predetermined cycle. Hereinafter, this operation will be briefly described using FIG. 5.

Figure 5:
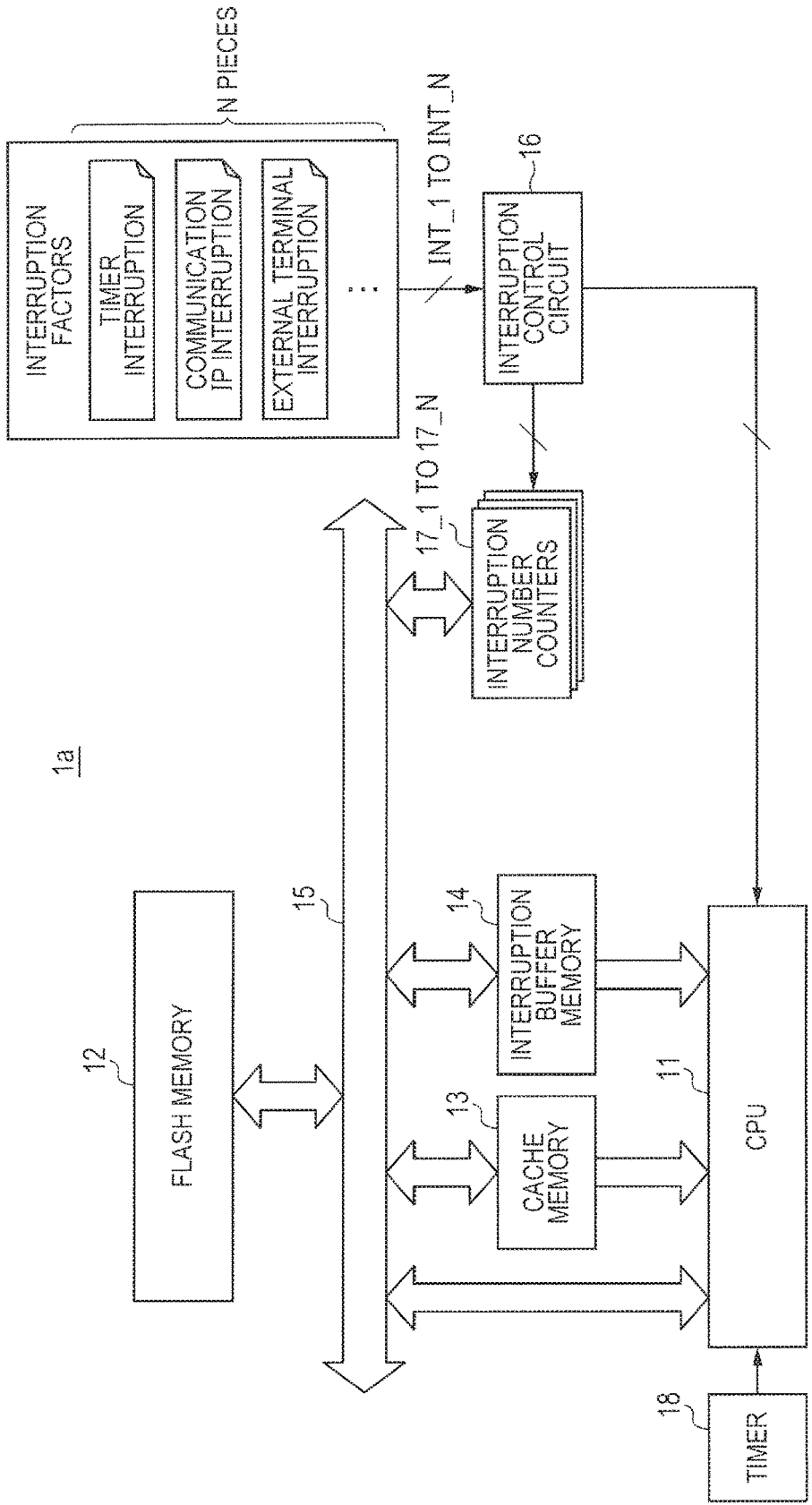
FIG. 5 is a block diagram for showing a first modified example of the semiconductor device shown in FIG. 1.

FIG. 5 is a block diagram for showing a first modified example of the semiconductor device 1 as a semiconductor device 1a.

As shown in FIG. 5, the semiconductor device 1a further includes a timer 18 as compared to the semiconductor device 1. The other configurations of the semiconductor device 1a are the same as the case of the semiconductor device 1, and thus the explanation thereof will be omitted.

Here, in the case where a period of time measured by the timer 18 reaches a predetermined period of time, the CPU 11 rewrites the interruption subroutine programs stored in the interruption buffer memory 14. After rewriting the interruption subroutine programs, the timer 18 is initialized to start the measurement of a period of time again.

Thereby, the semiconductor device 1a rewrites the interruption subroutine programs stored in the interruption buffer memory 14 at a predetermined cycle.

(Second Modified Example of Semiconductor Device 1)

Further, a case in which all the M interruption subroutine programs already stored in the interruption buffer memory 14 are overwritten by the M interruption subroutine programs newly read from the flash memory 12 has been described as an example in the embodiment. However, the present invention is not limited to this. Only the interruption subroutine programs corresponding to the interruption factors excluded from those indicating up to the M-th highest occurrence frequencies may be rewritten by the interruption subroutine programs corresponding to the interruption factors newly added to those indicating up to the M-th highest occurrence frequencies. Hereinafter, this operation will be briefly described using FIG. 6.

Figure 6:
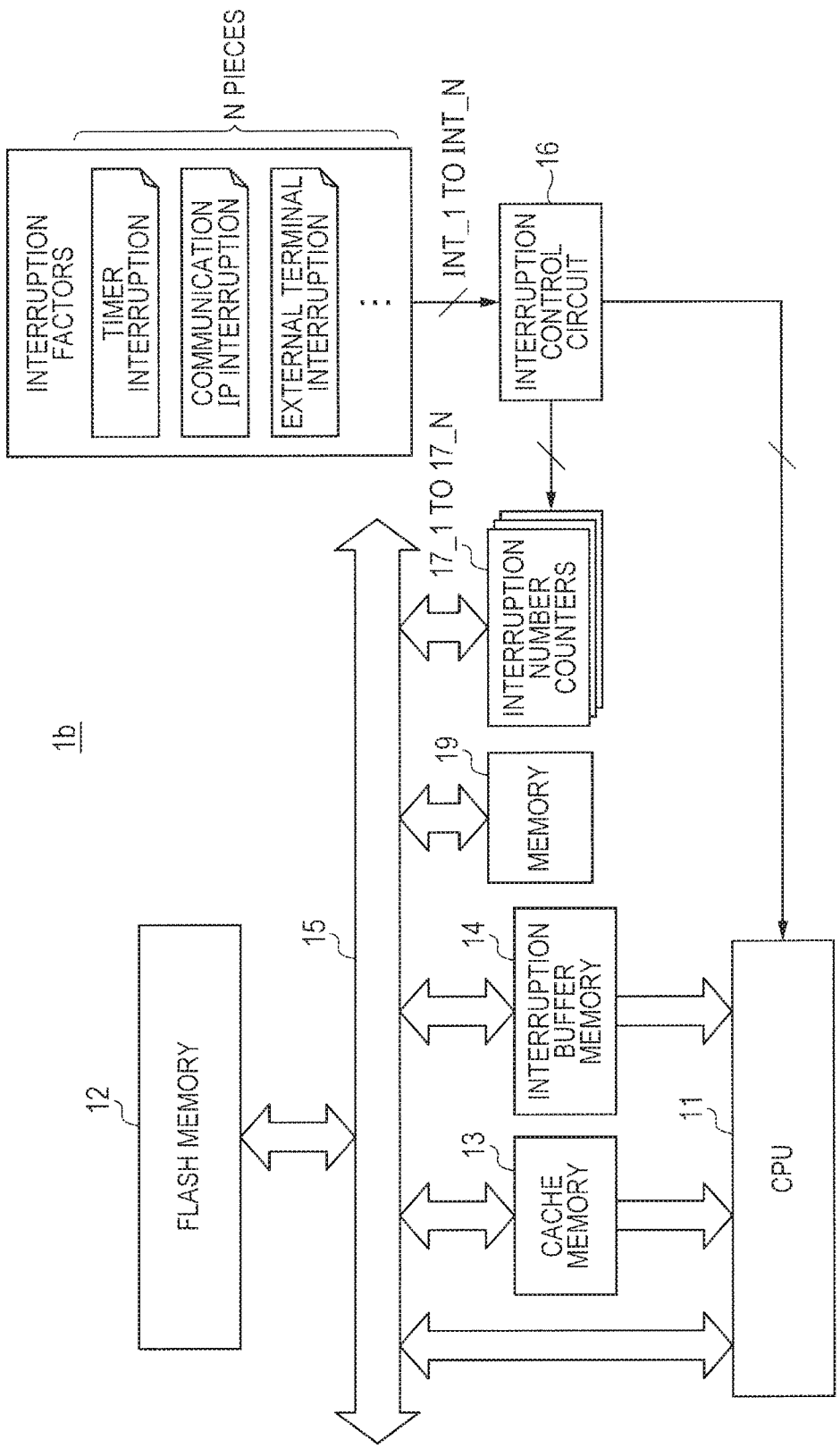
FIG. 6 is a block diagram for showing a second modified example of the semiconductor device shown in FIG. 1.

FIG. 6 is a block diagram for showing a second modified example of the semiconductor device 1 as a semiconductor device 1b.

As shown in FIG. 6, the semiconductor device 1b further includes a memory (determination result storage unit) 19 as compared to the semiconductor device 1. The other configurations of the semiconductor device 1b are the same as the case of the semiconductor device 1, and thus the explanation thereof will be omitted.

The count values counted by the respective interruption number counters 17_1 to 17_N last are stored in the memory 19. Here, the CPU 11 compares the count values of the respective counters 17_1 to 17_N stored in the memory 19 with count values newly counted by the respective counters 17_1 to 17_N. Thereby, the counters excluded from those indicating up to the M-th largest count values and the counters newly added to those indicating up to the M-th largest count values can be clarified. Accordingly, the CPU 11 rewrites the interruption subroutine programs corresponding to the counters excluded from those indicating up to the M-th largest count values to the interruption subroutine programs corresponding to the counters newly added to those indicating up to the M-th largest count values.

Thereby, the semiconductor device 1b can rewrite not all of but only a part of the M interruption subroutine programs stored in the interruption buffer memory 14.

Second Embodiment

Figure 7:
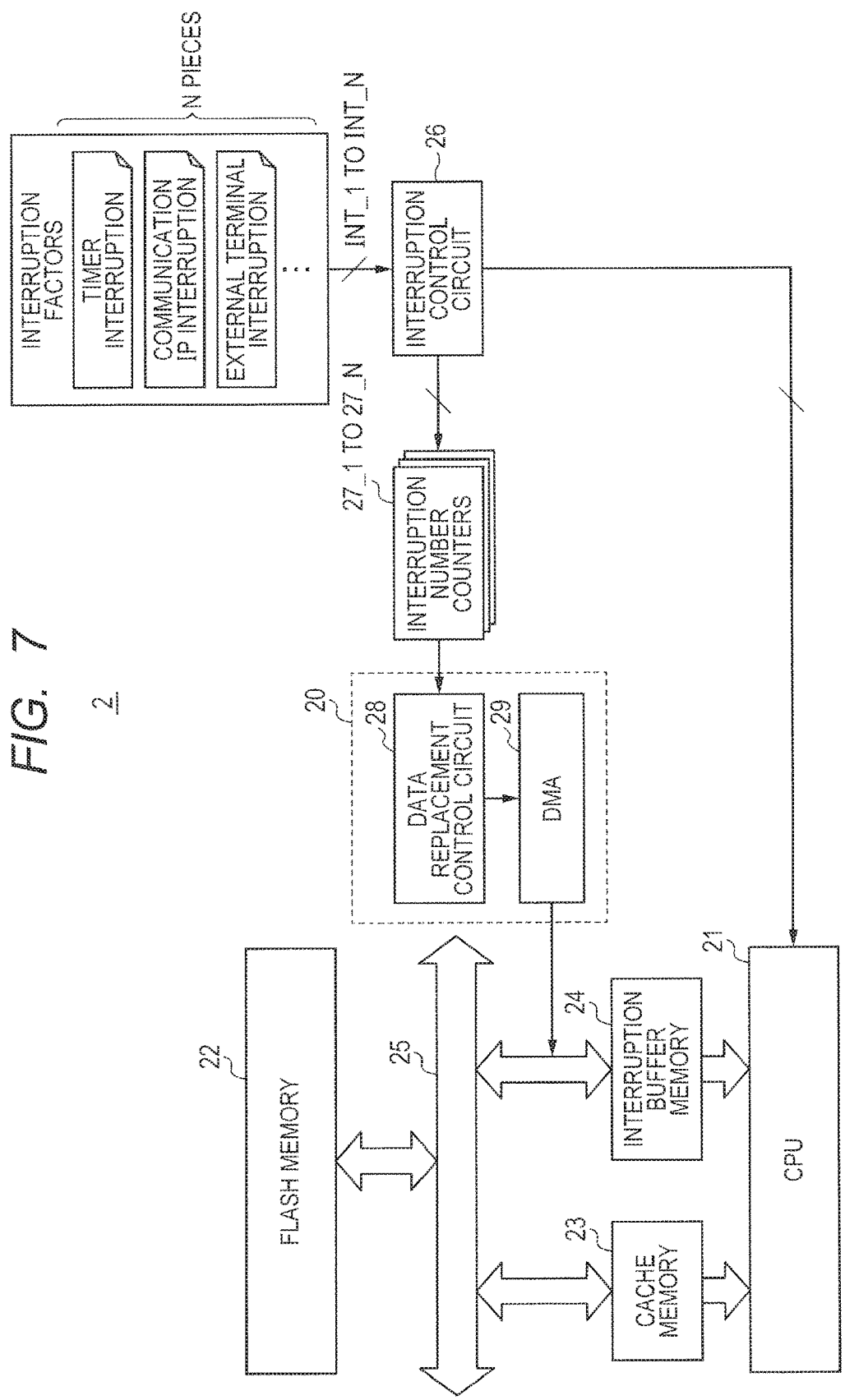
FIG. 7 is a diagram for showing a configuration example of a semiconductor device according to a second embodiment.

FIG. 7 is a block diagram for showing a configuration example of a semiconductor device 2 according to a second embodiment.

As shown in FIG. 7, the semiconductor device 2 includes a CPU 21, a flash memory 22, a cache memory 23, an interruption buffer memory 24, a data bus 25, an interruption control circuit 26, interruption number counters 27_1 to 27_N, and a data replacement unit 20. The data replacement unit 20 has a data replacement control circuit 28 and a DMA 29.

Here, the CPU 21, the flash memory 22, the cache memory 23, the interruption buffer memory 24, the data bus 25, the interruption control circuit 26, and the interruption number counter 27_1 to 27_N correspond to the CPU 11, the flash memory 12, the cache memory 13, the interruption buffer memory 14, the data bus 15, the interruption control circuit 16, and the interruption number counter 17_1 to 17_N in the semiconductor device 1, respectively.

Namely, the semiconductor device 2 further includes the data replacement unit 20 as compared to the semiconductor device 1.

Instead of the CPU 21, the data replacement unit 20 stores the M interruption subroutine programs corresponding to the counters indicating up to the M-th largest count values into the interruption buffer memory 14. Thereby, the operation load of the CPU 21 can be reduced. The other configurations and operations of the semiconductor device 2 are the same as the case of the semiconductor device 1, and thus the explanation thereof will be omitted.

(Operation of Semiconductor Device 2)

Next, an operation of the semiconductor device 2 will be described with reference to FIG. 8.

Figure 8:
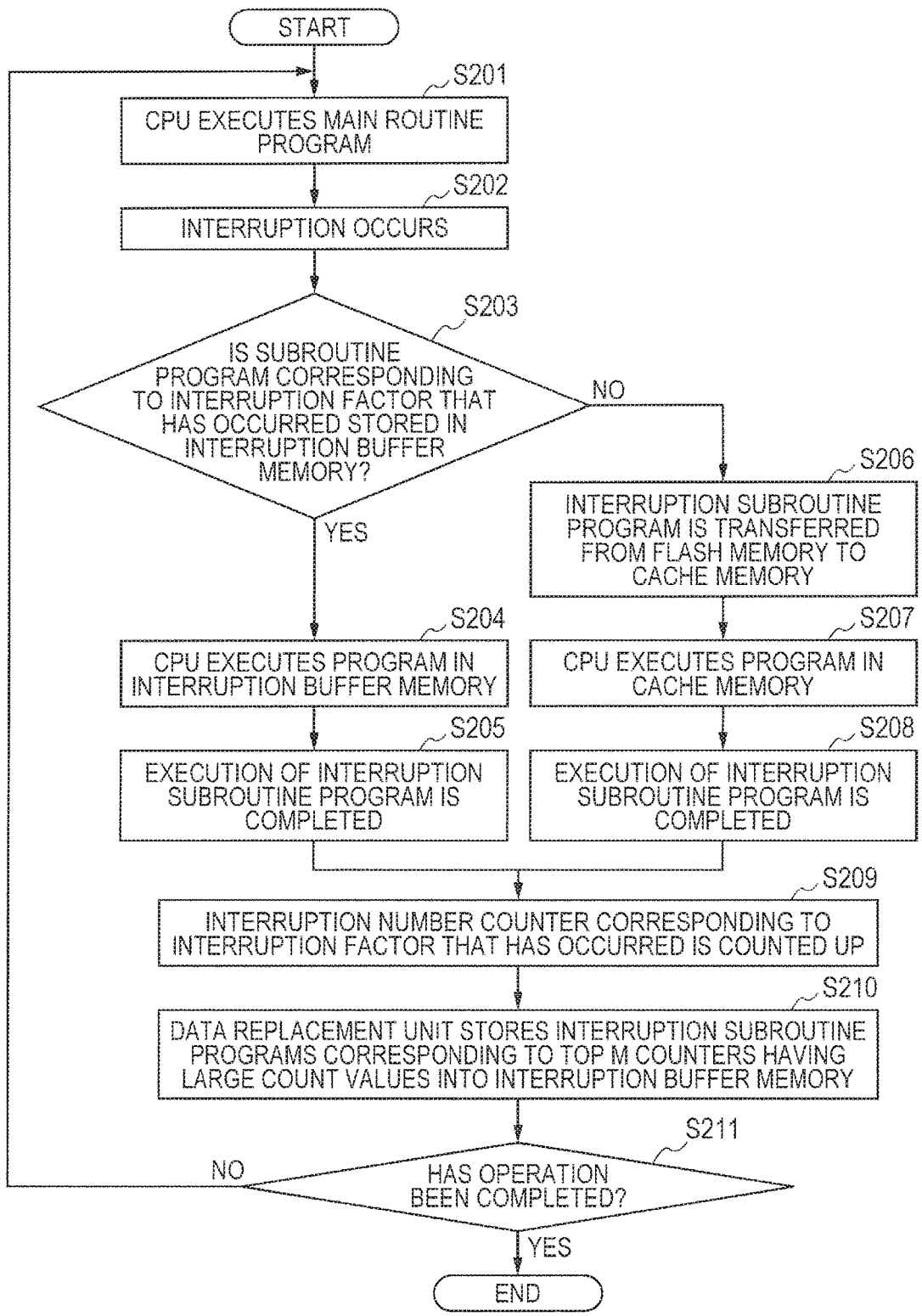
FIG. 8 is a flowchart for showing an operation of the semiconductor device shown in FIG. 7.

FIG. 8 is a flowchart for showing an operation of the semiconductor device 2. Here, the processes of Steps S201 to S211 of the semiconductor device 2 shown in FIG. 8 correspond to those of Steps S101 to S111 of the semiconductor device 1, respectively.

When the count-up operation performed by one of the interruption number counters 27_1 to 27_N is completed in the semiconductor device 2, the data replacement unit 20 reads the M interruption subroutine programs corresponding to the counters indicating up to the M-th largest count values among the interruption number counters 27_1 to 27_N from the flash memory 22, and stores the same into the interruption buffer memory 24 (Step S210). Thereby, the M interruption subroutine programs already stored in the interruption buffer memory 24 are overwritten by the M interruption subroutine programs newly read from the flash memory 22.

The other operations of the semiconductor device 2 are the same as the case of the semiconductor device 1, and thus the explanation thereof will be omitted.

As described above, the semiconductor device 2 according to the embodiment can exhibit the same effect as the semiconductor device 1. Further, the semiconductor device 2 according to the embodiment can reduce the operation load of the CPU 21 by writing the interruption subroutine programs into the interruption buffer memory 14 using the data replacement unit 20.

It should be noted that the semiconductor device 2 may also rewrite the interruption subroutine programs stored in the interruption buffer memory 14 at a predetermined cycle as similar to the case of the semiconductor device 1. Further, the semiconductor device 2 may also rewrite only the interruption subroutine programs corresponding to the interruption factors excluded from those indicating up to the M-th highest occurrence frequencies into the interruption subroutine programs corresponding to the interruption factors newly added to those indicating up to the M-th highest occurrence frequencies as similar to the case of the semiconductor device 1.

Next, some concrete configuration examples of the data replacement unit 20 will be described.

(First Concrete Configuration Example of Data Replacement Unit 20)

Figure 9:
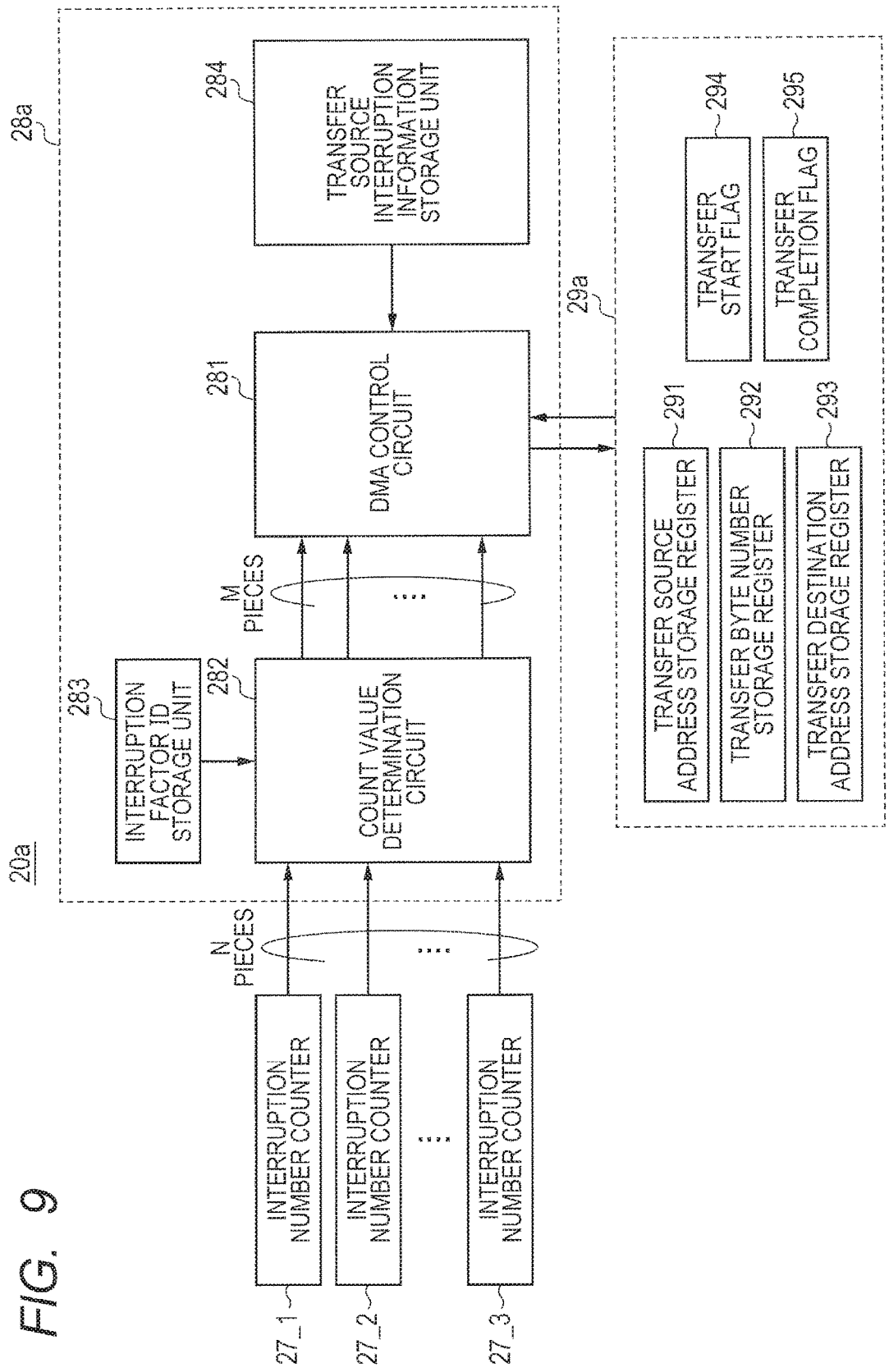
FIG. 9 is a diagram for showing a first concrete configuration example of a data replacement unit provided in the semiconductor device shown in FIG. 7.

FIG. 9 is a block diagram for showing a first concrete configuration example of the data replacement unit 20 as a data replacement unit 20a. As shown in FIG. 9, the data replacement unit 20a includes a data replacement control circuit 28a and a DMA 29a.

The data replacement control circuit 28a includes a DMA control circuit 281, a count value determination circuit 282, an interruption factor ID storage unit 283, and a transfer source interruption information storage unit 284. The DMA 29a includes a transfer source address storage register 291, a transfer byte number storage register 292, a transfer destination address storage register 293, a transfer start flag 294, and a transfer completion flag 295.

The count value determination circuit 282 determines the first to M-th M counters in descending order of count values from the respective count values of the N interruption number counters 27_1 to 27_N, reads M interruption factor IDs (Identification Information) corresponding to the M counters from the interruption factor ID storage unit 283, and outputs the same. Namely, the count value determination circuit 282 outputs the IDs of the interruption factors (interruption factor IDs) indicating up to the M-th highest occurrence frequencies.

First, the DMA control circuit 281 selects the interruption factor ID having the highest occurrence frequency among the M interruption factor IDs output from the count value determination circuit 282. Then, the DMA control circuit 281 obtains information of the interruption subroutine program corresponding to the selected interruption factor ID having the highest occurrence frequency from the transfer source interruption information storage unit 284, and outputs the same to the DMA 29a.

Here, the information of the interruption subroutine program includes, for example, the address (transfer source address) of the storage area of the flash memory 22 in which the interruption subroutine program is stored and the number of bytes of the interruption subroutine program. The information is stored in each of the transfer source address storage register 291 and the transfer byte number storage register 292 provided in the DMA 29a.

Further, the DMA control circuit 281 outputs address information of a storage area A_1 of the interruption buffer memory 24 where the interruption subroutine program corresponding to the interruption factor ID having the highest occurrence frequency is to be stored to the DMA 29a. The address information is stored into the transfer destination address storage register 293 provided in the DMA 29.

Thereafter, the DMA control circuit 281 sets the transfer start flag 294 provided in the DMA 29a to be active (for example, from the L level to the H level). Thereby, the DMA 29a reads the interruption subroutine program with the designated address from the flash memory 22, and starts to transfer the same to the storage area A_1 of the interruption buffer memory 24.

When the transfer is completed, the DMA 29a sets the transfer completion flag 295 to be active (for example, from the L level to the H level). Thereby, the DMA control circuit 281 switches the interruption factor ID selected among the M interruption factor IDs output from the count value determination circuit 282. Specifically, the DMA control circuit 281 selects the interruption factor ID having the second highest occurrence frequency among the M interruption factor IDs output from the count value determination circuit 282.

Such an operation is repeated for the interruption factor IDs having the second to M-th highest occurrence frequencies. Thereby, the M interruption subroutine programs corresponding to the M interruption factor IDs having the highest to M-th highest occurrence frequencies are stored into the storage areas A_1 to A_M of the interruption buffer memory 24, respectively.

(Second Concrete Configuration Example of Data Replacement Unit 20)

Figure 10:
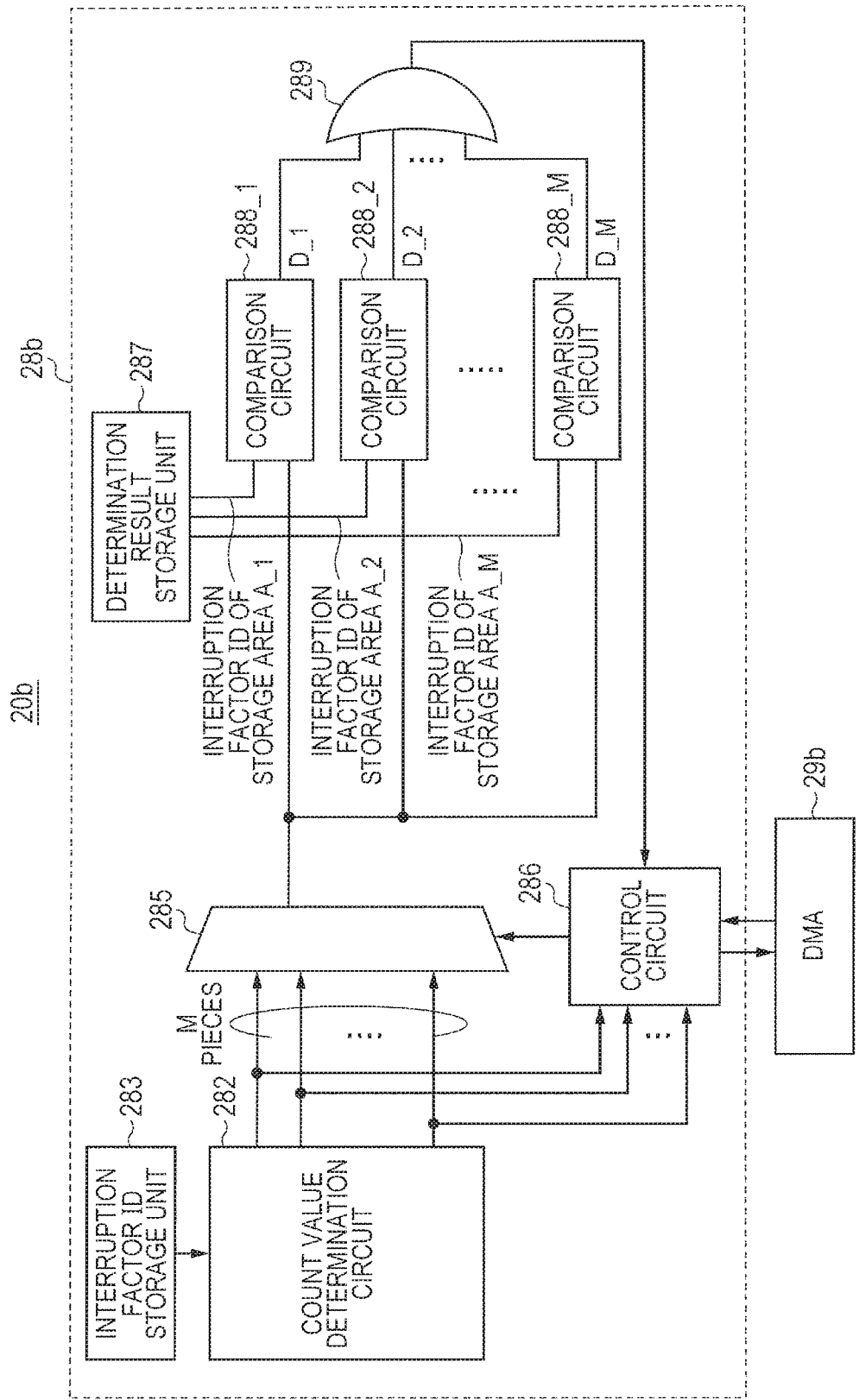
FIG. 10 is a diagram for showing a second concrete configuration example of the data replacement unit provided in the semiconductor device shown in FIG. 7.

FIG. 10 is a block diagram for showing a second concrete configuration example of the data replacement unit 20 as a data replacement unit 20b. As shown in FIG. 10, the data replacement unit 20b includes a data replacement control circuit 28b and a DMA 29b. It should be noted that the DMA 29b has the same configuration as the DMA 29a.

The data replacement control circuit 28b includes a count value determination circuit 282, an interruption factor ID storage unit 283, a selection circuit 285, a control circuit 286, a determination result storage unit 287, comparison circuits 288_1 to 288_M, and an OR circuit 289.

The count value determination circuit 282 determines the first to M-th M counters in descending order of count values from the respective count values of the N interruption number counters 27_1 to 27_N, reads M interruption factor IDs corresponding to the M counters from the interruption factor ID storage unit 283, and outputs the same. Namely, the count value determination circuit 282 outputs the IDs of the interruption factors (interruption factor IDs) indicating up to the M-th highest occurrence frequencies.

The control circuit 286 selects the M interruption factor IDs one by one in order, and outputs the same from the selection circuit 285. For example, the control circuit 286 first selects the interruption factor ID having the highest occurrence frequency among the M interruption factor IDs, and outputs the same from the selection circuit 285.

The M interruption factor IDs having the higher occurrence frequencies determined last are stored in the determination result storage unit 287. In other words, the M interruption factor IDs corresponding to the M subroutine programs stored in the interruption buffer memory 24 are stored in the determination result storage unit 287.

The comparison circuits 288_1 to 288_M compare the interruption factor IDs having the highest to M-th highest occurrence frequencies stored in the determination result storage unit 287 with those newly output from the selection circuit 285, respectively, and outputs comparison results D_1 to D_M. For example, in the case where the interruption factor IDs having the highest to M-th highest occurrence frequencies stored in the determination result storage unit 287 match those newly output from the selection circuit 285, respectively, the comparison circuits 288_1 to 288_M output the comparison results D_1 to D_M of the H level. Otherwise, the comparison circuits 288_1 to 288_M output the comparison results D_1 to D_M of the L level.

The OR circuit 289 outputs the logical sum of the comparison results D_1 to D_M as a determination result. For example, in the case where one of the comparison results D_1 to D_M indicates the H level, the OR circuit 289 outputs the determination result of the H level. In the case where all the comparison results D_1 to D_M indicate the L level, the OR circuit 289 outputs the determination result of the L level.

Namely, in the case where the interruption factor ID (in this case, the interruption factor ID having the highest occurrence frequency) newly output from the selection circuit 285 is included in the highest to M-th interruption factors stored in the determination result storage unit 287, the OR circuit 289 outputs the determination result of the H level. Otherwise, the OR circuit 289 outputs the determination result of the L level.

When receiving the determination result from the OR circuit 289, the control circuit 286 switches the selection of the interruption factor ID by the selection circuit 285. For example, the control circuit 286 switches the interruption factor ID having the highest occurrence frequency to the interruption factor ID having the second highest occurrence frequency, and outputs the same from the selection circuit 285. Thereafter, when receiving the determination result from the OR circuit 289, the control circuit 286 switches the selection of the interruption factor ID by the selection circuit 285 again. For example, the control circuit 286 switches the interruption factor ID having the second highest occurrence frequency to the interruption factor ID having the third highest occurrence frequency, and outputs the same from the selection circuit 285. Thereafter, the interruption factor ID having the M-th highest occurrence frequency is selected by the selection circuit 285, and the determination result is output from the OR circuit 289. Such an operation is repeated.

The control circuit 286 extracts from the determination results the interruption factor ID among the M interruption factor IDs having the higher occurrence frequencies stored in the determination result storage unit 287 that does not match any of the latest M interruption factor IDs having the higher occurrence frequencies. The interruption factor having the extracted ID can be regarded as the interruption factor determined to be excluded from those indicating up to the M-th highest occurrence frequencies. Further, the control circuit 286 extracts from the determination results the interruption factor ID among the latest M interruption factor IDs having the higher occurrence frequencies that does not match any of the M interruption factor IDs having the higher occurrence frequencies stored in the determination result storage unit 287. The interruption factor having the extracted ID can be regarded as the interruption factor determined to be newly added to those indicating up to the M-th highest occurrence frequencies.

The control circuit 286 outputs to the DMA 29b the information (the transfer source address and the number of bytes) of the interruption subroutine program corresponding to the interruption factor determined to be newly added to those indicating up to the M-th highest occurrence frequencies. Further, the control circuit 286 outputs to the DMA 29b the address (transfer destination address) of the interruption buffer memory 24 in which the interruption subroutine program corresponding to the interruption factor determined to be excluded from those indicating up to the M-th highest occurrence frequencies is stored.

Thereafter, the DMA 29b reads from the flash memory 22 the interruption subroutine program corresponding to the interruption factor determined to be newly added to those indicating up to the M-th highest occurrence frequencies. Then, interruption subroutine program is overwritten into the storage area of the interruption buffer memory 24 in which the interruption subroutine program corresponding to the interruption factor determined to be excluded from those indicating up to the M-th highest occurrence frequencies is stored.

Thereby, only the interruption subroutine program corresponding to the interruption factor determined to be excluded from those indicating up to the M-th highest occurrence frequencies is rewritten by the interruption subroutine program corresponding to the interruption factor determined to be newly added to those indicating up to the M-th highest occurrence frequencies.

(Modified Example of Semiconductor Device 2)

Figure 11:
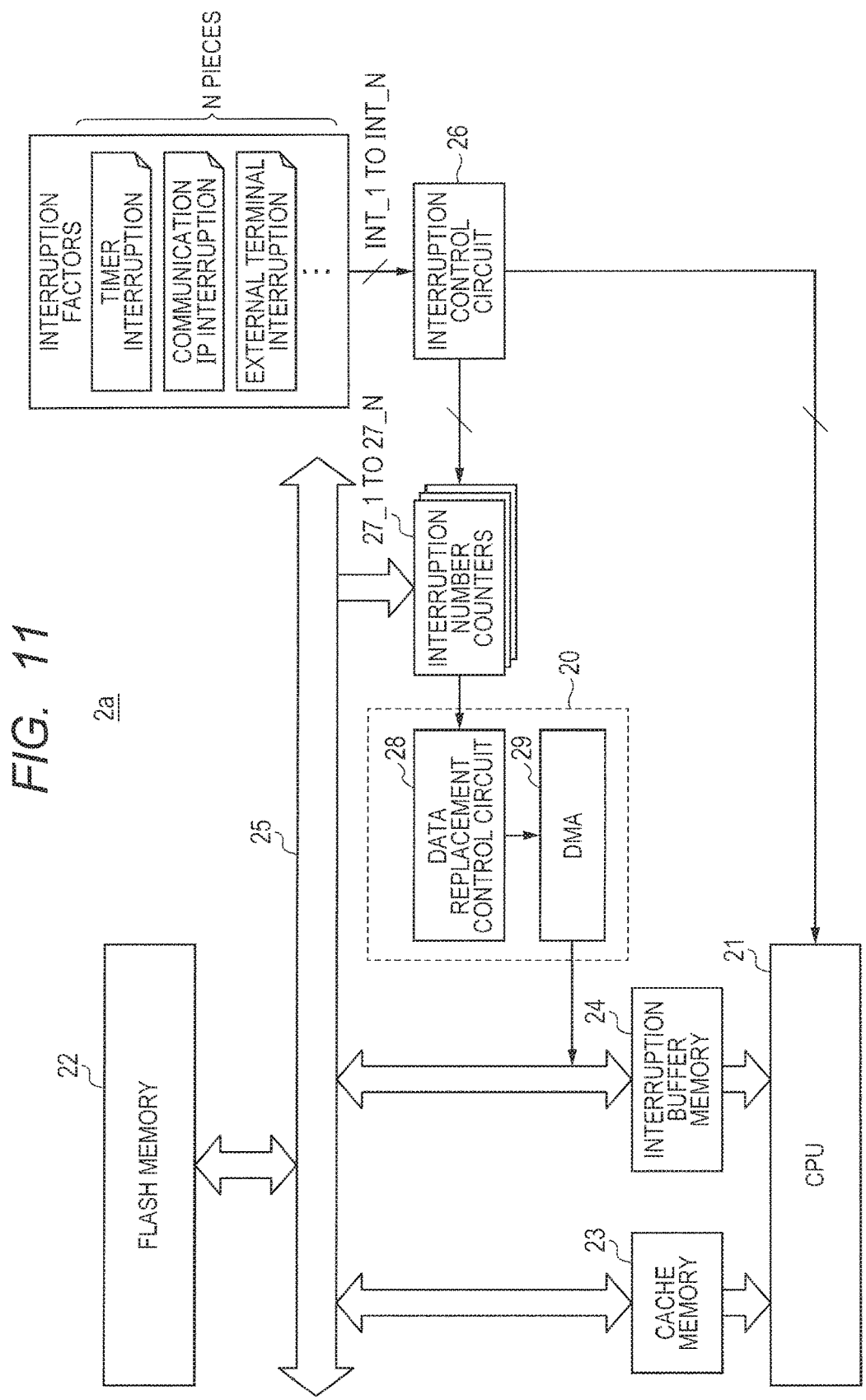
FIG. 11 is a block diagram for showing a modified example of the semiconductor device shown in FIG. 7.

FIG. 11 is a block diagram for showing a modified example of the semiconductor device 2 as a semiconductor device 2a. In the semiconductor device 2a, the interruption number counters 27_1 to 27_N are further coupled to the data bus 25, as compared to the case of the semiconductor device 2. The other configurations of the semiconductor device 2a are the same as the case of the semiconductor device 2, and thus the explanation thereof will be omitted.

The semiconductor device 2a is configured in such a manner that the respective count values of the interruption number counters 27_1 to 27_N can be changed to arbitrary values by the CPU 21. Thereby, the semiconductor device 2a can change the interruption factors indicating up to the M-th highest occurrence frequencies in accordance with a time zone.

For example, in the case where the semiconductor device 2a is continuously operated all day long, there is a possibility that the occurrence frequency of the interruption differs according to the time zones of morning, daytime, and night. Accordingly, the respective count values of the interruption number counters 27_1 to 27_N are reset to an arbitrary value (for example, "0") when each of the time zones of morning, daytime, and night starts, so that the influence of the count values in different time zones can be eliminated. Thereby, the practicability of the semiconductor device 2a can be enhanced.

Third Embodiment

Figure 12:
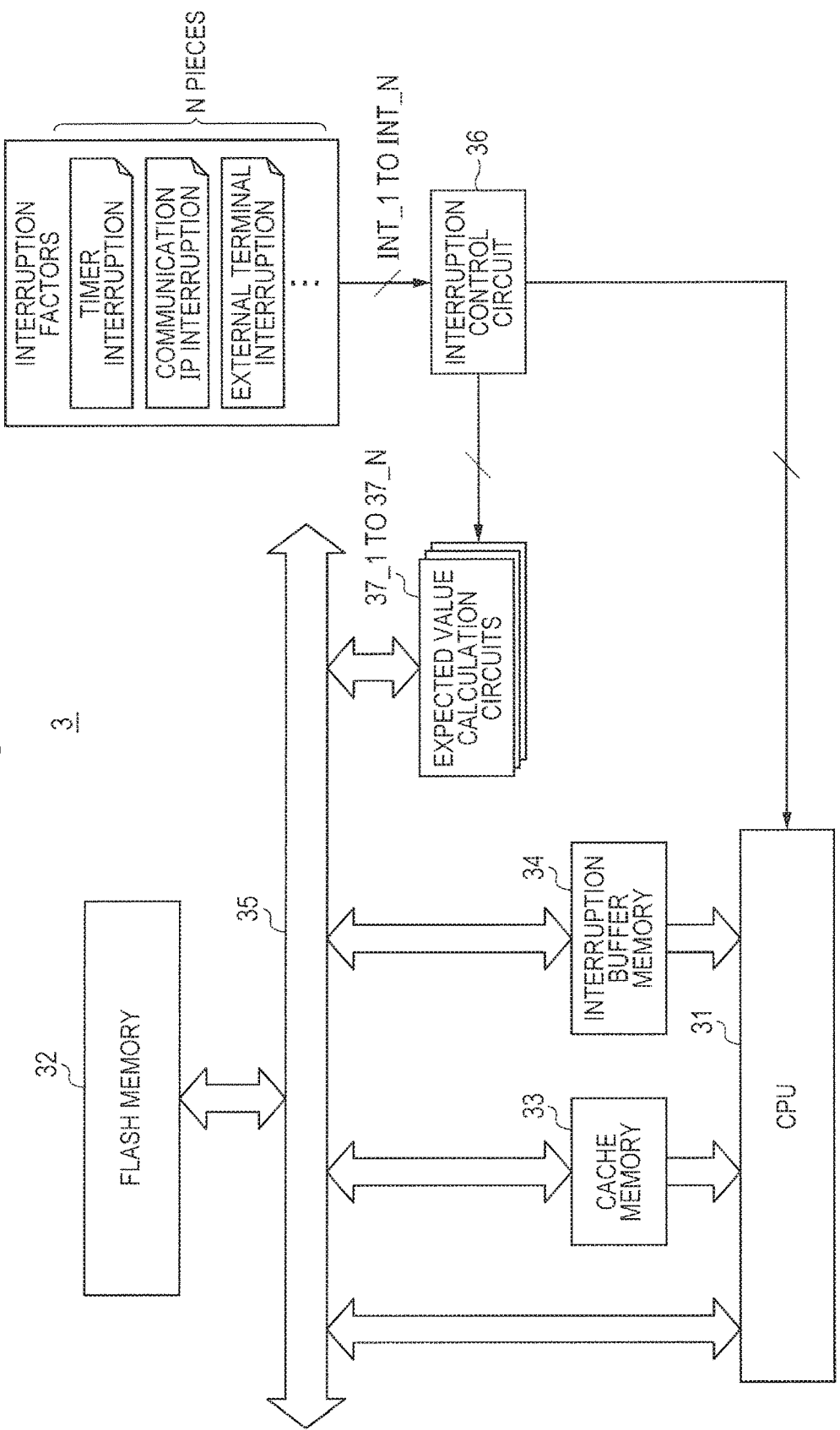
FIG. 12 is a block diagram for showing a configuration example of a semiconductor device according to a third embodiment.

FIG. 12 is a block diagram for showing a configuration example of a semiconductor device 3 according to a third embodiment.

As shown in FIG. 12, the semiconductor device 3 includes a CPU 31, a flash memory 32, a cache memory 33, an interruption buffer memory 34, a data bus 35, an interruption control circuit 36, and expected value calculation circuits 37_1 to 37_N.

Here, the CPU 31, the flash memory 32, the cache memory 33, the interruption buffer memory 34, the data bus 35, and the interruption control circuit 36 correspond to the CPU 11, the flash memory 12, the cache memory 13, the interruption buffer memory 14, the data bus 15, and the interruption control circuit 16 in the semiconductor device 1, respectively.

Namely, the semiconductor device 3 further includes the expected value calculation circuits 37_1 to 37_N as compared to the semiconductor device 1. Each of the expected value calculation circuits 37_1 to 37_N calculates the expected value of the occurrence probability of the N interruptions INT_1 to INT_N of factors using the Bayesian statistic formula. Accordingly, the occurrence probability can be accurately derived as compared to a case in which the occurrence probability is estimated on the basis of the occurrence frequency.

Specifically, in the case where parameters $\alpha_i$ and $\beta_i$ represented when the initial setting value of the expected value is $E_i$ and the initial setting value of the dispersion value is $V_i$ are assumed as $\alpha_i = E_i[\{E_i(1-V_i)/V_i\}-1]$ and $\beta_i = (1-E_i)[\{E_i(1-V_i)/V_i\}-1]$, respectively, in the expected value calculation circuit 37_i (i is an integer from 1 to N), the expected value $\mu_i$ of the occurrence probability of the interruption INT_i can be represented as ($\alpha_i$+the number of interruption occurrences of the interruption factors in charge)/($\alpha_i+\beta_i$+the number of interruption occurrences of all the N interruption factors).

It should be noted that in the case where the initial setting value $E_i$ of the expected value pi of the occurrence probability of the interruption INT_i and the initial setting value $V_i$ of the dispersion value are already known, these values may be substituted into the above-described equations of the parameters $\alpha_i$ and $\beta_i$. On the other hand, in the case where the initial setting value $E_i$ of the expected value $\mu_i$ of the occurrence probability of the interruption INT_i and the initial setting value $V_i$ of the dispersion value are unknown, the initial setting value $E_i$ and the initial setting value $V_i$ that are estimated empirically and subjectively may be substituted into the above-described equations of the parameters $\alpha_i$ and $\beta_i$. For example, in the case where the occurrence probability of the interruption INT_1 is set to 30%±10% and the occurrence probability of the interruption INT_2 is set to 20%±10%, the initial setting value $E_1$, the initial setting value $V_1$, the initial setting value $E_2$, and the initial setting value $V_2$ may be set to 0.3, 0.01, 0.2, and 0.01, respectively.

(Configuration Example of Expected Value Calculation Circuits 37_1 to 37_N)

Figure 13:
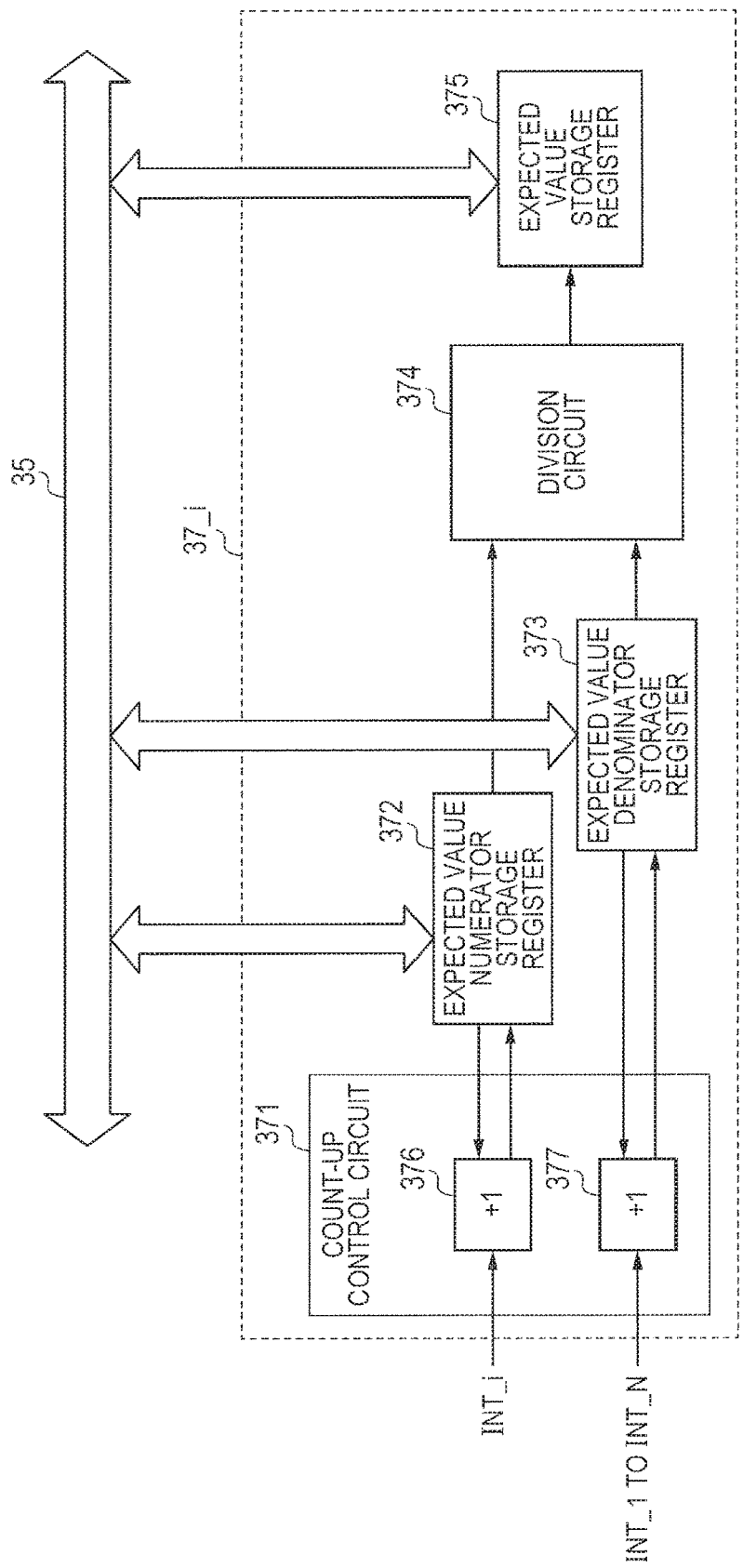
FIG. 13 is a block diagram for showing a configuration example of an expected value calculation circuit provided in the semiconductor device shown in FIG. 12.

FIG. 13 is a block diagram for showing a configuration example of the expected value calculation circuit 37_i (i is an integer from 1 to N). As shown in FIG. 13, the expected value calculation circuit 37_i includes a count-up control circuit 371, an expected value numerator storage register 372, an expected value denominator storage register 373, a division circuit 374, and an expected value storage register 375. The count-up control circuit 371 has adder circuits 376 and 377.

The value of the numerator of the expected value $\mu_i$ of the occurrence probability of the interruption INT_i is stored in the expected value numerator storage register 372. The value of the denominator of the expected value $\mu_i$ of the occurrence probability of the interruption INT_i is stored in the expected value denominator storage register 373. In the case where the interruption INT_i has occurred, the adder circuit 376 counts up the value of the numerator of the expected value $\mu_i$ stored in the expected value numerator storage register 372 by one. Then, the counted-up value is stored into the expected value numerator storage register 372. In the case where one of the interruptions INT_1 to INT_N has occurred, the adder circuit 377 counts up the value of the denominator of the expected value $\mu_i$ stored in the expected value denominator storage register 373 by one. Then, the counted-up value is stored into the expected value denominator storage register 373.

The division circuit 374 divides the value of the numerator of the expected value $\mu_i$ stored in the expected value numerator storage register 372 by the value of the denominator of the expected value $\mu_i$ stored in the expected value denominator storage register 373, and outputs the division result. The division result is stored into the expected value storage register 375.

FIG. 14 is a diagram for showing an example of changes in the expected values $\mu_1$ to $\mu_N$ of the occurrence probabilities of the interruptions INT_1 to INT_N. As shown in FIG. 14, the expected values $\mu_1$ to $\mu_N$ of the occurrence probabilities of the interruptions INT_1 to INT_N at a given point are represented, for example, as follows.

$$\mu_1 = \alpha_1/(\alpha_1 + \beta_1)$$
$$\mu_2 = \alpha_2/(\alpha_2 + \beta_2)$$
$$\mu_3 = \alpha_3/(\alpha_3 + \beta_3)$$
$$\vdots$$
$$\mu_N = \alpha_N/(\alpha_N + \beta_N)$$

Here, it is assumed that, for example, the interruption INT_3 has occurred. At this time, when the expected values $\mu_1$ to $\mu_N$ of the occurrence probabilities of the interruptions INT_1 to INT_N are expected values $\mu_1'$ to $\mu_N'$, the expected values $\mu_1'$ to $\mu_N'$ are represented as follows.

$$\mu_1' = \alpha_1/(\alpha_1 + \beta_1 + 1)$$
$$\mu_2' = \alpha_2/(\alpha_2 + \beta_2 + 1)$$
$$\mu_3' = (\alpha_3 + 1)/(\alpha_3 + \beta_3 + 1)$$
$$\vdots$$
$$\mu_N' = \alpha_N/(\alpha_N + \beta_N + 1)$$

FIG. 15 is a diagram for showing the distribution and changes of the occurrence probability of each of the interruptions INT_1 to INT_N. The horizontal axis represents the occurrence probability of each of the interruptions INT_1 to INT_N, and the vertical axis represents probability density distribution with respect to the occurrence probability of each of the interruptions INT_1 to INT_N. It should be noted that FIG. 15 shows the expected values $\mu_1$ to $\mu_N$ calculated using the above-described Bayesian statistic formula as the mean values of the occurrence probabilities of the interruptions INT_1 to INT_N.

The left side of FIG. 15 shows the distribution of the occurrence probabilities of the interruptions INT_1 to INT_N at a given point. Here, it is assumed that, for example, the interruption INT_3 has occurred. Accordingly, as shown on the right side of FIG. 15, the distribution of the occurrence probabilities of the interruptions INT_1 to INT_N is changed. Specifically, the occurrence probability of the interruption INT_3 is increased, and the occurrence probabilities of the other interruptions are decreased. Further, the expected value $\mu_3$ of the interruption INT_3 calculated using the above-described Bayesian statistic formula, and the expected values $\mu_1$ to $\mu_2$, and $\mu_4$ to $\mu_N$ of the occurrence probabilities of the other interruptions are decreased.

(Operation of Semiconductor Device 3)

Next, an operation of the semiconductor device 3 will be described with reference to FIG. 16.

Figure 16:
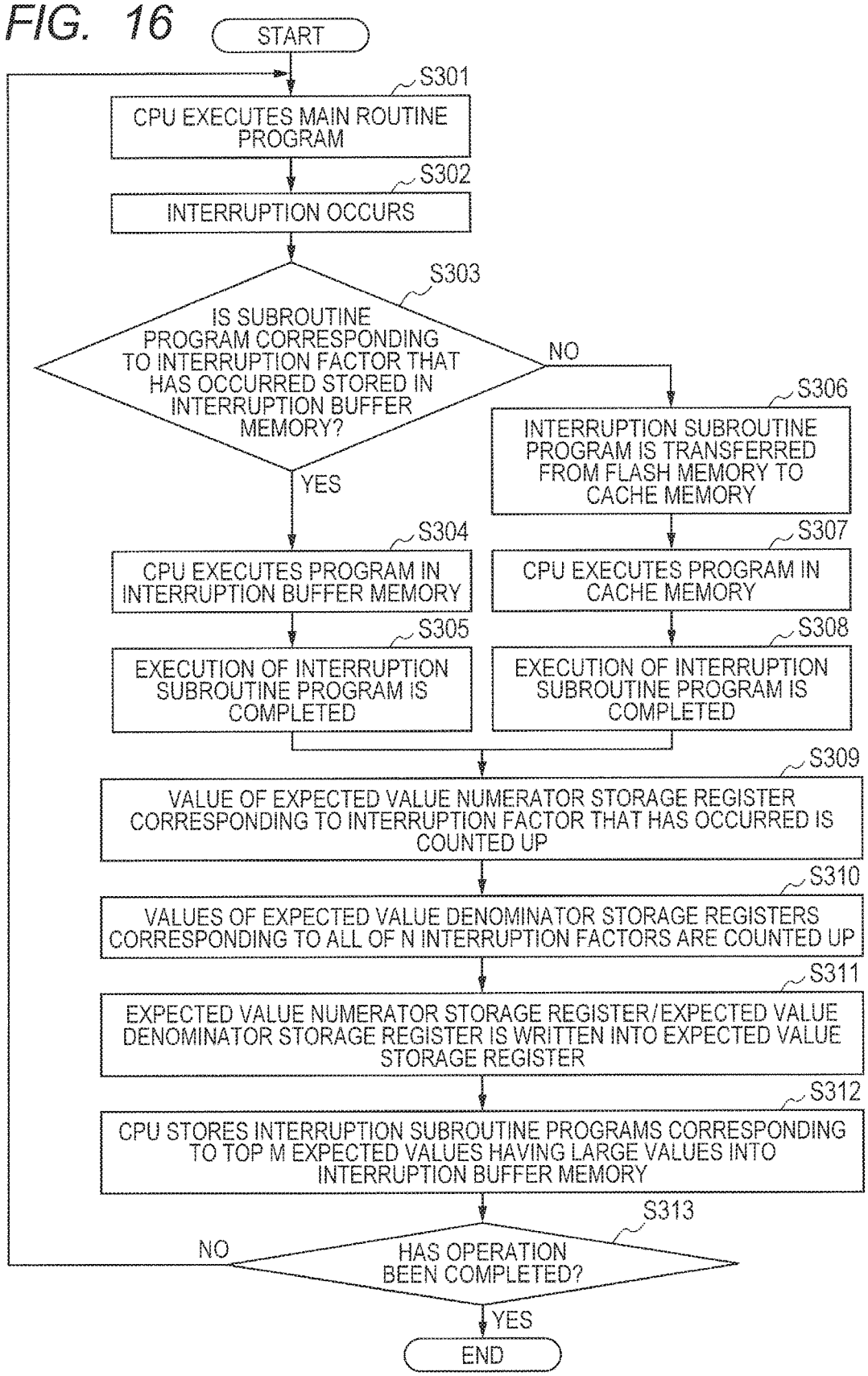
FIG. 16 is a flowchart for showing an operation of the semiconductor device shown in FIG. 12.

FIG. 16 is a flowchart for showing an operation of the semiconductor device 3. Here, the processes of Steps S301 to S308 of the semiconductor device 3 shown in FIG. 16 correspond to those of Steps S101 to S108 of the semiconductor device 1, respectively.

When the execution of the interruption subroutine program is completed in the semiconductor device 3 (Steps S305 and S308), the stored value of the expected value numerator storage register 372 corresponding to the interruption factor that has occurred is counted up (S309). Further, the stored values of the N expected value denominator storage registers 373 corresponding to all the N interruption factors are counted up (S310). Thereafter, the stored value of the expected value numerator storage register 372 is divided by the stored value of the expected value denominator storage register 373, and the division result is written into the expected value storage register 375 (Step S311).

When the calculation of the expected values $\mu_1$ to $\mu_N$ by the expected value calculation circuits 37_1 to 37_N is completed, the CPU 31 reads the M interruption subroutine programs corresponding to the expected values indicating up to the M-th largest values among the expected values $\mu_1$ to $\mu_N$ from the flash memory 32, and stores the same into the interruption buffer memory 34 (Step S312). Thereby, the M interruption subroutine programs already stored in the interruption buffer memory 34 are overwritten by the M interruption subroutine programs newly read from the flash memory 32.

Thereafter, in the case where the operation by the CPU 31 is completed (YES in Step S313), the semiconductor device 3 terminates the operation. In the case where the operation by the CPU 31 is not completed (NO in Step S313), the flow returns to the process of Step S301 to repeat the operations from Step S301 to S313.

The other operations of the semiconductor device 3 are the same as the case of the semiconductor device 1, and thus the explanation thereof will be omitted.

As described above, the semiconductor device 3 according to the embodiment includes the interruption buffer memory 34 that stores therein only the M interruption subroutine programs corresponding to the M interruption factors having the high expected values of the occurrence probabilities among the N interruption factors. Thereby, the semiconductor device 3 according to the embodiment can reduce the storage area of the interruption buffer memory 34, and can accordingly suppress the circuit scale and the power consumption from being increased while mainlining a high interruption response performance. Here, the semiconductor device 3 according to the embodiment calculates the expected values of the occurrence probabilities of the interruptions INT_1 to INT_N of the N factors using the Bayesian statistic formula. Thereby, the semiconductor device 3 according to the embodiment can accurately derive the occurrence probability as compared to a case in which the occurrence probability is estimated on the basis of the occurrence frequency.

In the embodiment, a case in which the expected values are calculated on the basis of the beta distribution of the Bayesian statistic has been described as an example. However, the present invention is not limited to this, and the expected values may be calculated on the basis of another probability distribution such as the normal distribution or the gamma distribution.

Further, the semiconductor device 3 may further include a data replacement unit that rewrites the interruption subroutine programs of the interruption buffer memory 34 as similar to the case of the semiconductor device 2. Thereby, the operation load of the CPU 31 can be reduced.

Further, the semiconductor device 3 may also rewrite the interruption subroutine programs stored in the interruption buffer memory 34 at a predetermined cycle as similar to the cases of the semiconductor devices 1 and 2. Further, the semiconductor device 3 may also rewrite only the interruption subroutine programs corresponding to the interruption factors excluded from those indicating up to the M-th highest occurrence probabilities into the interruption subroutine programs corresponding to the interruption factors newly added to those indicating up to the M-th highest occurrence probabilities as similar to the cases of the semiconductor devices 1 and 2.

As described above, each of the semiconductor devices 1 to 3 according to the above-described first to third embodiments includes the interruption buffer memory that stores therein only the M interruption subroutine programs corresponding to the M interruption factors determined to be high in the occurrence probability among the N interruption factors. Thereby, each of the semiconductor devices 1 to 3 according to the above-described first to third embodiments can reduce the storage area of the interruption buffer memory, and can accordingly suppress the circuit scale and the power consumption from being increased while maintaining a high interruption response performance.

The invention achieved by the inventors has been concretely described above on the basis of the embodiments. However, it is obvious that the present invention is not limited to the above-described embodiments, but can be variously changed without departing from the scope thereof.

For example, each of the semiconductor devices according to the above-described embodiments may be configured to invert the conductive type (p-type or n-type) of the semiconductor substrate, the semiconductor layer, the diffusion layer (diffusion area), and the like. Therefore, in the case where one conductive type of the n-type and p-type is a first conductive type and the other is a second conductive type, the first conductive type can be the p-type, and the second conductive type can be the n-type. On the contrary, the first conductive type can be the n-type, and the second conductive type can be the p-type.

What is claimed is:

1. A semiconductor device, comprising:
a flash memory in which at least N (N is an integer equal to or larger than 2) interruption subroutine programs are stored;
an interruption control circuit that detects that an interruption of one of N interruption factors has occurred;
a determination circuit that determines an occurrence probability of each of the N interruption factors on a basis of a detection result of the interruption control circuit;
an interruption buffer memory in which M (M<N) interruption subroutine programs corresponding to top M interruption factors determined to be high in the occurrence probability by the determination circuit among the N interruption factors are stored; and
an arithmetic processing circuit that reads, in a case where an interruption of one of the M interruption factors has occurred, the interruption subroutine program corresponding to the interruption that has occurred from the interruption buffer memory, and executes the same,
wherein the arithmetic processing circuit compares previous information of the occurrence probability of each of the N interruption factors with new information of the occurrence probability of each of the N interruption factors determined by the determination circuit.

2. The semiconductor device according to claim 1, wherein the arithmetic processing circuit reads the M interruption subroutine programs corresponding to the top M interruption factors determined to be high in the occurrence probability by the determination circuit among the N interruption subroutine programs from the flash memory, and stores the same into the interruption buffer memory.

3. The semiconductor device according to claim 1, further comprising a determination result storage unit, in which the previous information of the occurrence probability of each of the N interruption factors determined by the determination circuit, is stored,
wherein the arithmetic processing circuit compares the previous information of the occurrence probability of each of the N interruption factors stored in the determination result storage unit with the new information of the occurrence probability of each of the N interruption factors newly determined by the determination circuit, and rewrites the interruption subroutine programs corresponding to the interruption factors to be excluded from the M interruption factors indicating up to M-th highest occurrence probabilities into the interruption subroutine programs corresponding to the interruption factors to be newly added to the M interruption factors indicating up to the M-th highest occurrence probabilities.

4. The semiconductor device according to claim 1, wherein the determination circuit includes N counters each counting up a count value in accordance with the occurrence of the interruption of each of the N interruption factors, and
wherein the M interruption subroutine programs corresponding to counters indicating up to M-th largest count values among the N counters are stored in the interruption buffer memory.

5. The semiconductor device according to claim 4, wherein the arithmetic processing circuit reads the M interruption subroutine programs corresponding to the counters indicating up to the M-th largest count values among the N counters from the flash memory, and stores the same into the interruption buffer memory.

6. The semiconductor device according to claim 4, further comprising a determination result storage unit in which the count value of each of the N counters is stored,
wherein the arithmetic processing circuit compares the count value of each of the N counters stored in the determination result storage unit with a count value newly counted by each of the N counters, and rewrites the interruption subroutine programs corresponding to the counters to be excluded from those indicating up to the M-th largest count values into the interruption subroutine programs corresponding to the counters to be newly added to those indicating up to the M-th largest count values.

7. The semiconductor device according to claim 1, wherein the determination circuit includes N expected value calculation circuits each calculating an expected value of the occurrence probability of the interruption of each of the N interruption factors in accordance with the occurrence of the interruption of each of the N interruption factors, and
wherein the M interruption subroutine programs corresponding to M expected value calculation circuits that calculate expected values of up to M-th highest occurrence probabilities among the N expected value calculation circuits are stored in the interruption buffer memory.

8. The semiconductor device according to claim 7, wherein the arithmetic processing circuit reads the M interruption subroutine programs corresponding to the M expected value calculation circuits that calculate the expected values of up to the M-th highest occurrence probabilities among the N expected value calculation circuits from the flash memory, and stores the same into the interruption buffer memory.

9. The semiconductor device according to claim 7, further comprising a determination result storage unit in which g calculation result of each of the N expected value calculation circuits is stored,
wherein the arithmetic processing circuit compares the calculation result of each of the N expected value calculation circuits stored in the determination result storage unit with a calculation result newly calculated by each of the N expected value calculation circuits, and rewrites the interruption subroutine programs corresponding to the expected value calculation circuits to be excluded from the M expected value calculation circuits that calculate the expected values of up to the M-th highest occurrence probabilities into the interruption subroutine programs corresponding to the expected value calculation circuits to be newly added to the M expected value calculation circuits that calculate the expected values of up to the M-th highest occurrence probabilities.

10. The semiconductor device according to claim 7, wherein, when parameters $\alpha$ and $\beta$ represented in g case where an initial setting value of the expected value is E and an initial setting value of the dispersion value is V are assumed as $\alpha=E[\{E(1-V)/V\}-1]$ and $\beta=(1-E)[\{E(1-V)/V\}-1]$, respectively, an expected value $\mu$ of the occurrence probability of an interruption is represented as $\mu=(\alpha+\text{the number of interruption occurrences of the interruption factors in charge})/(\alpha+\beta+\text{the number of interruption occurrences of all the N interruption factors})$.

11. The semiconductor device according to claim 1, further comprising a data replacement unit that reads the M interruption subroutine programs corresponding to the top M interruption factors determined to be high in the occurrence probability by the determination circuit among the N interruption subroutine programs from the flash memory, and stores the same into the interruption buffer memory.

12. The semiconductor device according to claim 11, further comprising a determination result storage unit in which the previous information of the occurrence probability of each of the N interruption factors determined by the determination circuit is stored,
wherein the data replacement unit compares the previous information of the occurrence probability of each of the N interruption factors stored in the determination result storage unit with the new information of the occurrence probability of each of the N interruption factors newly determined by the determination circuit, and rewrites the interruption subroutine programs corresponding to the interruption factors to be excluded from those indicating up to M-th highest occurrence probabilities into the interruption subroutine programs corresponding to the interruption factors to be newly added to those indicating up to the M-th highest occurrence probabilities.

13. The semiconductor device according to claim 1, further comprising a determination result storage unit in which the previous information of the occurrence probability of each of the N interruption factors, determined by the determination circuit, is stored.

14. The semiconductor device according to claim 1, wherein the arithmetic processing circuit rewrites the interruption subroutine programs corresponding to the interruption factors to be excluded from the M interruption factors indicating up to M-th highest occurrence probabilities into the interruption subroutine programs corresponding to the interruption factors to be newly added to the M interruption factors indicating up to the M-th highest occurrence probabilities.

15. The semiconductor device according to claim 1, wherein the determination circuit includes N counters, and
wherein the M interruption subroutine programs corresponding to counters indicating up to M-th largest count values among the N counters are stored in the interruption buffer memory.

16. The semiconductor device according to claim 1, wherein the determination circuit includes N expected value calculation circuits each calculating an expected value of the occurrence probability of the interruption of each of the N interruption factors in accordance with the occurrence of the interruption of each of the N interruption factors.

17. A control method of a semiconductor device the control method comprising:
detecting that an interruption of one of N (N is an integer equal to or larger than 2) interruption factors has occurred;
determining an occurrence probability of each of the N interruption factors on a basis of a detection result;
reading M (M<N) interruption subroutine programs corresponding to top M interruption factors determined to be high in the occurrence probability among the N interruption factors from a flash memory to store the same into an interruption buffer memory;
reading, in g case where an interruption of one of the M interruption factors has occurred, the interruption subroutine program corresponding to the interruption that has occurred from the interruption buffer memory to execute the same; and
comparing previous information of the occurrence probability of each of th N interruption factors with new information of the occurrence probability of each of the N interruption factors.

18. The control method according to claim 17, further comprising:
reading the M interruption subroutine programs corresponding to the top M interruption factors determined to be high in the occurrence probability among the N interruption subroutine programs.

19. The control method according to claim 17, further comprising:
storing the previous information of the occurrence probability of each of the N interruption factors.

20. A semiconductor device, comprising:
a flash memory in which at least N (N is an integer equal to or larger than 2) interruption subroutine programs are stored;
an interruption control circuit that detects that an interruption of one of N interruption factors has occurred;
a determination circuit that determines an occurrence probability of each of the N interruption factors on a basis of a detection result of the interruption control circuit;
an interruption buffer memory in which M (M<N) interruption subroutine programs corresponding to top M interruption factors determined to be high in the occurrence probability by the determination circuit among the N interruption factors are stored; and
an arithmetic processing circuit that reads, in a case where an interruption of one of the M interruption factors has occurred, the interruption subroutine program corresponding to the interruption that has occurred from the interruption buffer memory, and executes the same; and
a data replacement unit that reads the M interruption subroutine programs corresponding to the top M interruption factors determined to be high in the occurrence probability by the determination circuit among the N interruption subroutine programs from the flash memory, and stores the same into the interruption buffer memory.

* * * * *